United States Patent
Suetsugu et al.

(10) Patent No.: US 7,972,763 B2
(45) Date of Patent: Jul. 5, 2011

(54) CHEMICALLY AMPLIFIED POSITIVE RESIST COMPOSITION

(75) Inventors: Masumi Suetsugu, Osaka (JP); Makoto Akita, Hsin-Chu (TW); Kazuhiko Hashimoto, Osaka (JP)

(73) Assignee: Sumitomo Chemical Company, Limited, Tokyo (JP)

(*) Notice: Subject to any disclaimer, the term of this patent is extended or adjusted under 35 U.S.C. 154(b) by 678 days.

(21) Appl. No.: 11/984,098

(22) Filed: Nov. 13, 2007

(65) Prior Publication Data

US 2008/0153036 A1 Jun. 26, 2008

(30) Foreign Application Priority Data

Nov. 29, 2006 (JP) .................................. 2006-321460

(51) Int. Cl.
*G03F 7/039* (2006.01)
(52) U.S. Cl. ...................... 430/270.1; 430/326; 430/905
(58) Field of Classification Search .................. None
See application file for complete search history.

(56) References Cited

U.S. PATENT DOCUMENTS

| | | | | |
|---|---|---|---|---|
| 4,405,708 A * | 9/1983 | van Pelt et al. | ............ | 430/281.1 |
| 6,048,661 A * | 4/2000 | Nishi et al. | .................. | 430/270.1 |
| 2003/0134223 A1* | 7/2003 | Katano et al. | ................. | 430/191 |
| 2005/0244740 A1* | 11/2005 | Maruyama et al. | ........ | 430/270.1 |
| 2006/0234158 A1* | 10/2006 | Hatakeyama | .............. | 430/270.1 |
| 2009/0081589 A1* | 3/2009 | Toukhy et al. | ............. | 430/286.1 |

FOREIGN PATENT DOCUMENTS

| | | |
|---|---|---|
| JP | 11-282164 A | 10/1999 |
| JP | 2000-66400 A | 3/2000 |
| JP | 2000-292927 A | 10/2000 |
| JP | 2004-354609 A | 12/2004 |

* cited by examiner

*Primary Examiner* — Sin J. Lee
(74) *Attorney, Agent, or Firm* — Birch, Stewart, Kolasch & Birch, LLP

(57) ABSTRACT

The present invention provides a chemically amplified positive resist composition comprising (A) a resin obtainable by reacting a novolak resin, a poly(hydroxystyrene) and a compound having at least two vinyl ether structures, and (B) an acid generator.

11 Claims, No Drawings

CHEMICALLY AMPLIFIED POSITIVE RESIST COMPOSITION

This nonprovisional application claims priority under 35 U.S.C. §119(a) on Patent Application No. 2006-321460 filed in JAPAN on Nov. 29, 2006, the entire contents of which are hereby incorporated by reference.

FIELD OF THE INVENTION

The present invention relates to a chemically amplified positive resist composition.

BACKGROUND OF THE INVENTION

A chemically amplified positive resist composition is used for semiconductor microfabrication employing a lithography process using i-rays, KrF, ArF and electron beam; forming a bump or a thick film resist pattern in the production of semiconductor devices; forming a wiring pattern or a thick film resist laminated body in the production of circuit board; and the like.

It is expected for the chemically amplified resist composition to give patterns having high resolution.

US 2005/0244740 A1 discloses a chemically amplified positive resist composition comprising a resin obtainable by reacting a novolac resin and 1,4-bis(vinyloxymethyl)cyclohexane; 2,6-di(tert-butyl)-p-cresol; and an acid generator.

US 2005/0244740 A1 also discloses a chemically amplified positive resist composition comprising a resin obtainable by reacting a hydroxystyrene-styrene copolymer and 1,4-bis(vinyloxymethyl)cyclohexane, 2,6-di(tert-butyl)-p-cresol and an acid generator.

SUMMARY OF THE INVENTION

An object of the present invention is to provide a chemically amplified positive resist composition giving patterns having high resolution.

This and other objects of the present invention will be apparent from the following description.

The present invention relates to the followings:

<1> A chemically amplified positive resist composition comprising (A) a resin obtain able by reacting a novolak resin, a poly(hydroxystyrene) and a compound having at least two vinyl ether structures, and (B) an acid generator;

<2> The chemically amplified positive resist composition according to <1>, wherein the poly(hydroxystyrene) is a poly(p-hydroxystyrene);

<3> The chemically amplified positive resist composition according to <1> or <2>, wherein the amount ratio of the novolak resin and the poly(hydroxystyrene) in the reaction of the novolak resin, the poly(hydroxystyrene) and the compound having at least two vinyl ether structures is 30/70 to 70/30;

<4> The chemically amplified positive resist composition according to <1>, <2> or <3>, wherein the compound having at least two vinyl ether structures is 1,4-bis(vinyloxymethyl)cyclohexane or 1,2-bis(vinyloxy)ethane;

<5> The chemically amplified positive resist composition according to <1>, <2> or <3>, wherein the compound having at least two vinyl ether structures is 1,4-bis(vinyloxymethyl)cyclohexane;

<6> The chemically amplified positive resist composition according to any one of <1> to <5>, wherein the chemically amplified positive resist composition further contains at least one selected from a poly(hydroxystyrene) wherein a part of hydroxyl groups are protected by 1-alkoxyalkyl groups which may be substituted or 2-oxocycloalkyl groups; a novolak resin; a poly(hydroxystyrene); and a resin containing a structural unit which has an acid-labile group and which itself is insoluble or poorly soluble in an aqueous alkali solution but becomes soluble in an aqueous alkali solution by the action of an acid;

<7> The chemically amplified positive resist composition according to any one of <1> to <5>, wherein the chemically amplified positive resist composition further comprises a poly(hydroxystyrene) wherein a part of hydroxyl groups are protected by 1-alkoxyalkyl groups which may be substituted or 2-oxocycloalkyl groups;

<8> The chemically amplified positive resist composition according to <6> or <7>, wherein the 1-alkoxyalkyl group which may be substituted is an unsubstituted 1-alkoxyalkyl group or a 1-alkoxyalkyl group substituted with at least one selected from an alkoxy group and an acyloxy group;

<9> The chemically amplified positive resist composition according to <6> or <7>, wherein the poly(hydroxystyrene) wherein a part of hydroxyl groups are protected by 1-alkoxyalkyl groups which may be substituted or 2-oxocycloalkyl groups is a poly(hydroxystyrene) comprising a structural unit represented by the formula (Ia):

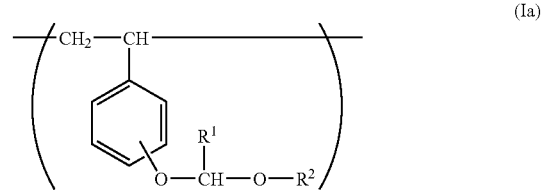

wherein $R^1$ represents a C1-C4 alkyl group and $R^2$ represents a C1-C6 alkyl group or a C5-C7 cycloalkyl group, or $R^1$ and $R^2$ are bonded to form a trimethylene group or a tetramethylene group, and a structural unit represented by the formula (Ib):

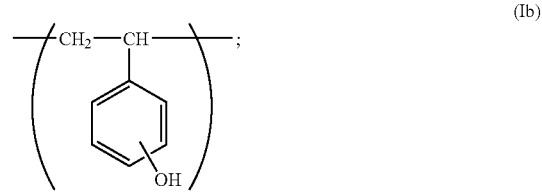

<10> The chemically amplified positive resist composition according to <9>, wherein the structural unit represented by the formula (Ia) is a structural unit represented by the formula (Ic):

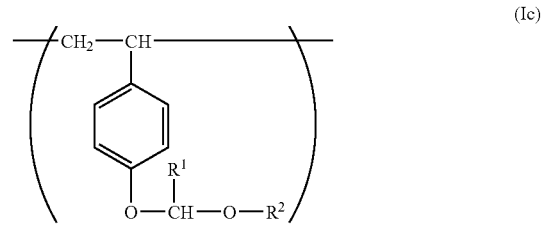

wherein R¹ represents a C1-C4 alkyl group and R² represents a C1-C6 alkyl group or a C5-C7 cycloalkyl group, or R¹ and R² are bonded to form a trimethylene group or a tetramethylene group, and the structural unit represented by the formula (Ib) is a structural unit represented by the formula (Id):

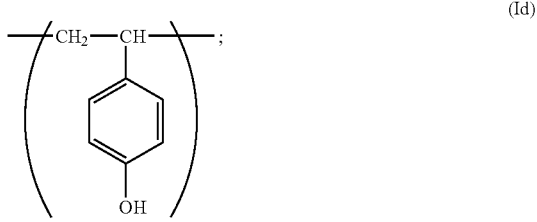

<11> The chemically amplified positive resist composition according to any one of <1> to <10>, wherein the chemically amplified positive resist composition contains 0.1 to 10% by weight of the acid generator based on the total amount of the resin component and the acid generator;
<12> The chemically amplified positive resist composition according to any one of <1> to <11>, wherein the chemically amplified positive resist composition further comprises a basic compound.

DESCRIPTION OF PREFERRED EMBODIMENTS

The present chemically amplified positive resist composition comprises (A) a resin obtainable by reacting a novolak resin, a poly(hydroxystyrene) and a compound having at least two vinyl ether structures (hereinafter, simply referred to as the vinyl ether compound), and (B) an acid generator.

First, the resin (A) will be illustrated.

The resin (A) is obtained by reacting the novolak resin, the poly(hydroxystyrene) and the vinyl ether compound.

The novolak resin is usually produced by a reaction of a phenol compound and an aldehyde compound in the presence of an acid catalyst.

Examples of the phenol compound include phenol, o-cresol, m-cresol, p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol, 2-tert-butyl-5-methylphenol, 2-methylresorcinol, 5-methylresorcinol, 2-methoxyphenol, 3-methoxyphenol, 4-methoxyphenol, 2,3-dimethoxyphenol, 2,5-dimethoxyphenol, 3,5-dimethoxyphenol, 2-methoxyresorcinol, 4-tert-butylcatechol, 2-ethylphenol, 3-ethylphenol, 4-ethylphenol, 2,5-diethylphenol, 3,5-diethylphenol, 2,3,5-triethylphenol, 2-naphthol, 1,3-dihydroxynaphthalene, 1,5-dihydroxynaphthalene, 1,7-dihydroxynaphthalene and a compound obtained by a condensation reaction of xylenol and hydroxybenzaldehyde.

These phenol compounds may be used alone or two or more thereof may be used in combination.

Among them, o-cresol, m-cresol, p-cresol, 2,3-xylenol, 2,5-xylenol, 3,4-xylenol, 3,5-xylenol, 2,3,5-trimethylphenol, 2-tert-butylphenol, 3-tert-butylphenol, 4-tert-butylphenol, 2-tert-butyl-4-methylphenol and 2-tert-butyl-5-methylphenol are preferable.

Examples of the aldehyde compound include formaldehyde, acetaldehyde, propionaldehyde, n-butyraldehyde, isobutyraldehyde, acrolein, crotonaldehyde, cyclohexanaldehyde, cyclopentanaldehyde, furfural, furylacrolein, benzaldehyde, o-methylbenzaldehyde, m-methylbenzaldehyde, p-methylbenzaldehyde, p-ethylbenzaldehyde, 2,4-dimethylbenzaldehyde, 2,5-dimethylbenzaldehyde, 3,4-dimethylbenzaldehyde, 3,5-dimethylbenzaldehyde, o-hydroxyaldehyde, m-hydroxybenzaldehyde, p-hydroxybenzaldehyde, phenylacetaldehyde and cinnamaldehyde. These aldehyde compounds may be used alone or two or more thereof may be used in combination.

Among them, formaldehyde is preferable in viewpoint of availability.

In the reaction of the phenol compound and the aldehyde compound, excess amount of the phenol compound is usually used relative to the amount of the aldehyde compound.

Examples of the acid catalyst include an inorganic acid such as hydrochloric acid, sulfuric acid, perchloric acid and phosphoric acid; an organic acid such as formic acid, acetic acid, oxalic acid, trichloroacetic acid and p-toluenesulonic acid; and a divalent metal salt such as zinc acetate, zinc chloride, magnesium acetate. These acid catalysts may be used alone or two or more thereof may be used in combination.

The amount of the acid catalyst is usually 0.01 to 1 mole relative to 1 mole of the aldehyde compound.

The reaction of the phenol compound and the aldehyde compound is usually conducted according to a known method for producing the novolak resin. The reaction temperature is usually 60 to 120° C. The reaction time is usually 2 to 30 hours. The reaction is usually conducted in an inert solvent.

After completion of the reaction, for example, the novolak resin can be isolated, for example, by washing the reaction mixture with water, if necessary, after adding a water-insoluble solvent to the reaction mixture, and then concentrating.

Examples of the poly(hydroxystyrene) include poly(o-hydroxystyrene), poly(m-hydroxystyrene) and poly(p-hydroxystyrene), and poly(p-hydroxystyrene) is preferable.

As the poly(hydroxystyrene), a commercially available one may be used and one produced according to a known method may be used.

As specific examples of the commercially available poly (p-hydroxystyrene), MARUKA LYNCUR (trade name) manufactured by Maruzen Petrochemical Co., Ltd., VP POLYMER (trade name) such as VP-2500 (trade name) manufactured by Nippon Soda Co., Ltd., and the like are exemplified.

As the vinyl ether compound, a compound having two vinyl ether structures may be used and a compound having more than three vinyl ether structures may be used. The compound having two vinyl ether structures is preferable. Herein, "the vinyl ether structure" means the following structure:

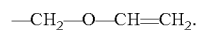
—CH₂—O—CH=CH₂.

Specific examples of the vinyl ether compound include 1,4-bis(vinyloxymethyl)cyclohexane and 1,2-bis(vinyloxy)ethane, and 1,4-bis(vinyloxymethyl)cyclohexane is preferable.

As the vinyl ether compound, a commercially available one is usually used.

The resin (A) can be produced by reacting the novolak resin, the poly(hydroxystyrene) and the vinyl ether compound in the presence of an acid catalyst. The reaction is usually conducted by mixing the novolak resin, the poly (hydroxystyrene), the vinyl ether compound and the acid catalyst in a solvent. The mixing order is not limited, and the reaction is preferably carried out by adding the vinyl ether compound to a mixture of the novolak resin, the poly(hydroxystyrene) and the acid catalyst.

In the reaction, the amount ratio of the novolak resin and the poly(hydroxystyrene) is preferably 30/70 to 70/30.

The amount of the vinyl ether compound is usually 1 to 30 parts by weight, preferably 2 to 15 parts by weight relative to 100 parts by weight of sum of the novolak resin and the poly(hydroxystyrene).

Examples of the acid catalyst include an inorganic acid such as hydrochloric acid, sulfuric acid, perchloric acid and phosphoric acid; and an organic acid such as formic acid, acetic acid, oxalic acid, trichloroacetic acid and p-toluenesulonic acid. These acid catalysts may be used alone or two or more thereof may be used in combination.

The amount of the acid catalyst is usually 0.0001 to 1% by weight relative to 1 part by weight of the poly(hydroxystyrene).

The solvent is not particularly limited in so far as it is an inert solvent on the reaction and Examples thereof include methyl isobutyl ketone. The amount of the solvent to be used is not particularly limited.

After completion of the reaction, for example, the resin (A) can be isolated, for example, by adding a basic compound such as triethylamine to the reaction mixture followed by washing the mixture obtained with water and then concentrating. The resin (A) isolated may be further purified by conventional purification means such as contacting with the ion-exchanged resin.

Next, the acid generator (B) will be illustrated.

The acid generator (B) generates an acid by irradiation to itself or the composition containing the same, and the acid generated catalytically acts against the resin (A), and the resin (A) becomes soluble in an aqueous alkali solution.

The acid generator (B) can be selected from various compounds generating the acid by irradiation with radiation on the acid generator itself or the present resist composition.

As the acid generator, at least one selected from an onium salt, a halogenated alkyltriazine compound, a disulfone compound, a diazomethane compound having a sulfonyl group, a sulfonate compound and an imide compound having a sulfonyloxy group, is preferable. The onium salt, the diazomethane compound having a sulfonyl group and a mixture thereof are more preferable.

Examples of the onium salt include the salts represented by the following formulae (Va), (Vb) and (Vc):

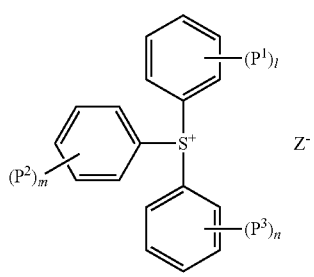

(Va)

wherein $Z^-$ represents an organic counter ion, $P^1$, $P^2$ and $P^3$ each independently represent a hydroxyl group, a C1-C6 alkyl group or a C1-C6 alkoxy group; l, m and n each independently represent an integer of 0 to 3; when l represents 2 or 3, $P^1$'s may be the same or different, when m represents 2 or 3, $P^2$'s may be the same or different, and when n represents 2 or 3, $P^3$'s may be the same or different,

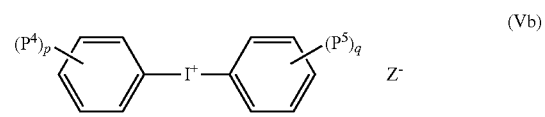

(Vb)

wherein $Z^-$ is the same as defined above, $P^4$ and $P^5$ each independently represent a hydroxyl group, a C1-C6 alkyl group or a C1-C6 alkoxy group; p and q each independently represent 0 or 1,

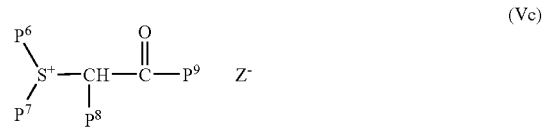

(Vc)

wherein $P^6$ and $P^7$ each independently represent a C1-C6 alkyl group or a C3-C10 cycloalkyl group, or $P^6$ and $P^7$ are bonded to form a C3-C7 divalent acyclic hydrocarbon group which forms a ring together with the adjacent $S^+$, and at least one —$CH_2$— in the divalent acyclic hydrocarbon group is optionally replaced with —CO—, —O— or —S—, $P^8$ represents a hydrogen atom, $P^9$ represents a C1-C6 alkyl group, a C3-C10 cycloalkyl group or an aromatic group which may be substituted, or $P^8$ and $P^9$ are bonded to form a divalent acyclic hydrocarbon group which forms a 2-oxocycloalkyl group together with the adjacent —CHCO—, and at least one —$CH_2$— in the divalent acyclic hydrocarbon group may be replaced with —CO—, —O— or —S—.

As the onium salt, the salt represented by the formula (Va) is preferable.

Examples of the C1-C6 alkyl group in the formulae (Va), (Vb) and (Vc) include a methyl, ethyl, n-propyl, isopropyl, n-butyl, isobutyl, sec-butyl, tert-butyl group, n-pentyl and n-hexyl group.

Examples of the C1-C6 alkoxy group in the formulae (Va) and (Vb) include a methoxy, ethoxy, n-propoxy, isopropoxy, n-butoxy, isobutoxy, sec-butoxy, tert-butoxy, n-pentyloxy and n-hexyloxy group.

Examples of the C3-C10 cycloalkyl group in the formula (Vc) include a cyclopropyl, cyclobutyl, cyclopentyl, cyclohexyl, cycloheptyl, cyclooctyl and cyclodecyl group.

Examples of the C3-C7 divalent acyclic hydrocarbon group formed by bonding $P^6$ and $P^7$ include a trimethylene, tetramethylene, pentamethylene group. Examples of the ring group formed together with the adjacent $S^+$ and the divalent C3-C7 acyclic hydrocarbon group include a tetramethylenesulfonio, pentamethylenesulfonio and oxybisethylenesulfonio group.

Examples of the aromatic group in the formula (Vc) include a phenyl, tolyl, xylyl and naphthyl group. Examples of the divalent acyclic hydrocarbon group formed by bonding $P^8$ and $P^9$ include a methylene, ethylene, trimethylene, tetramethylene and pentamethylene group and examples of the 2-oxocycloalkyl group formed together with the adjacent —CHCO— and the divalent acyclic hydrocarbon group include a 2-oxocyclopentyl and 2-oxocyclohexyl group.

Specific examples of the cation part of the salt represented by the formula (Va) include the followings:
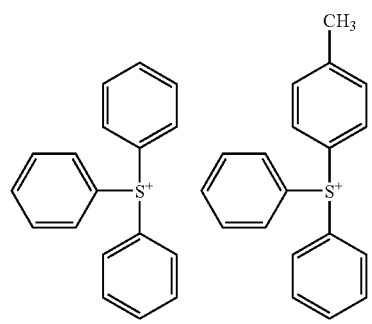
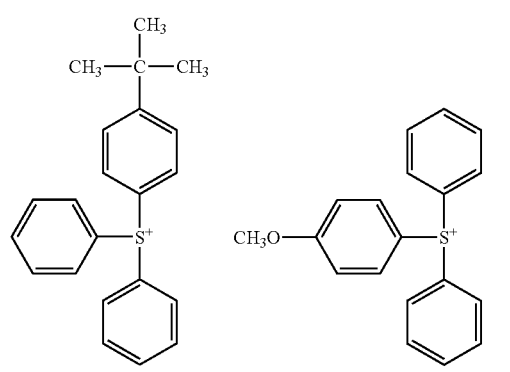
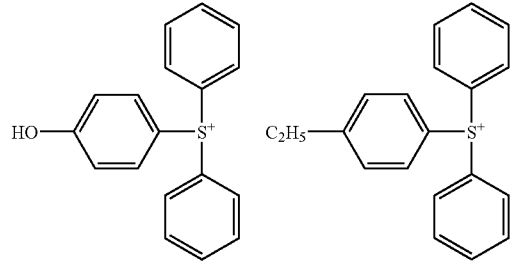
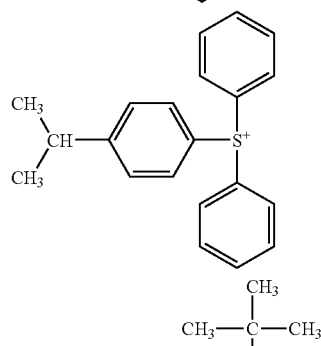
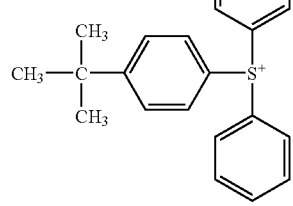
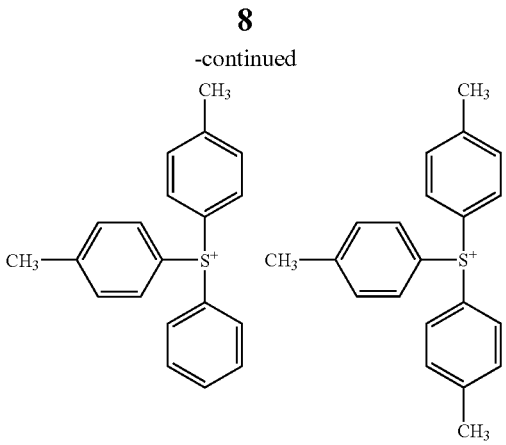
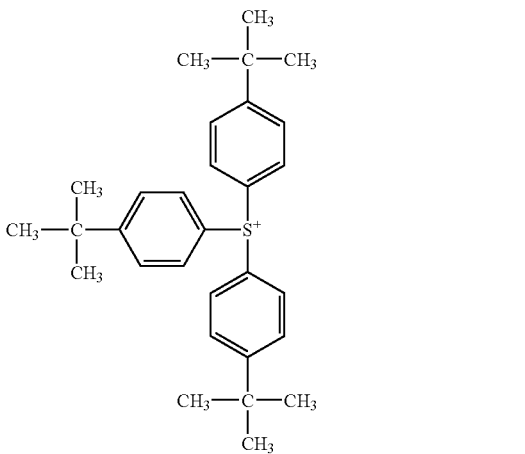
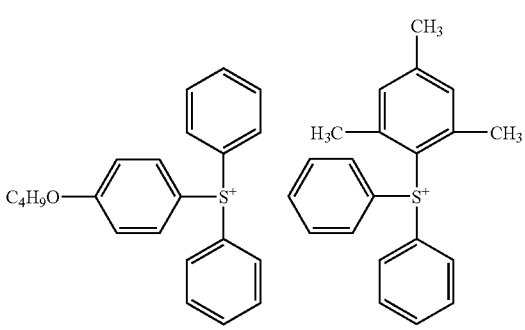
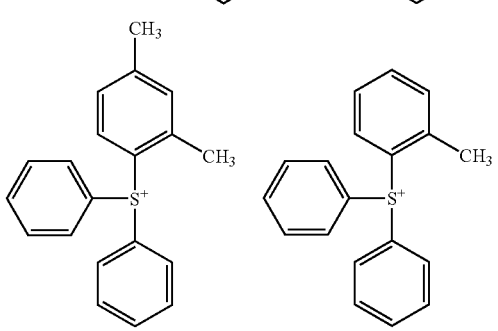
Specific examples of the cation part of the salt represented by the formula (Vb) include the followings:
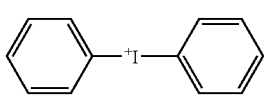

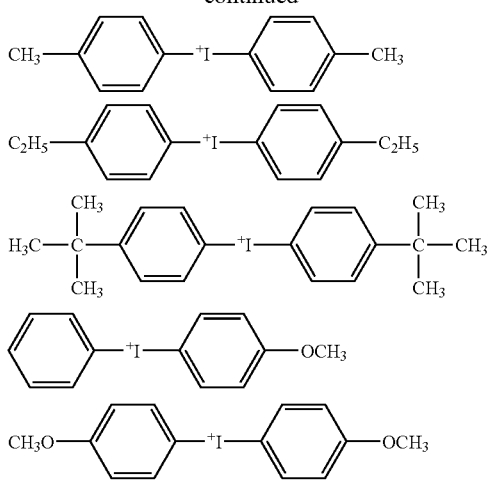

Specific examples of the cation part of the salt represented by the formula (Vc) include the followings:

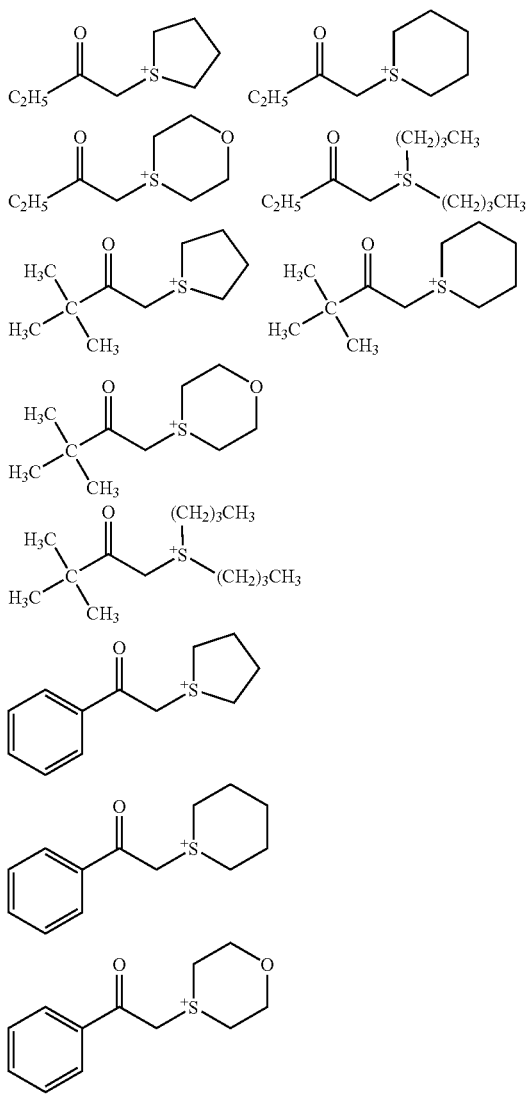

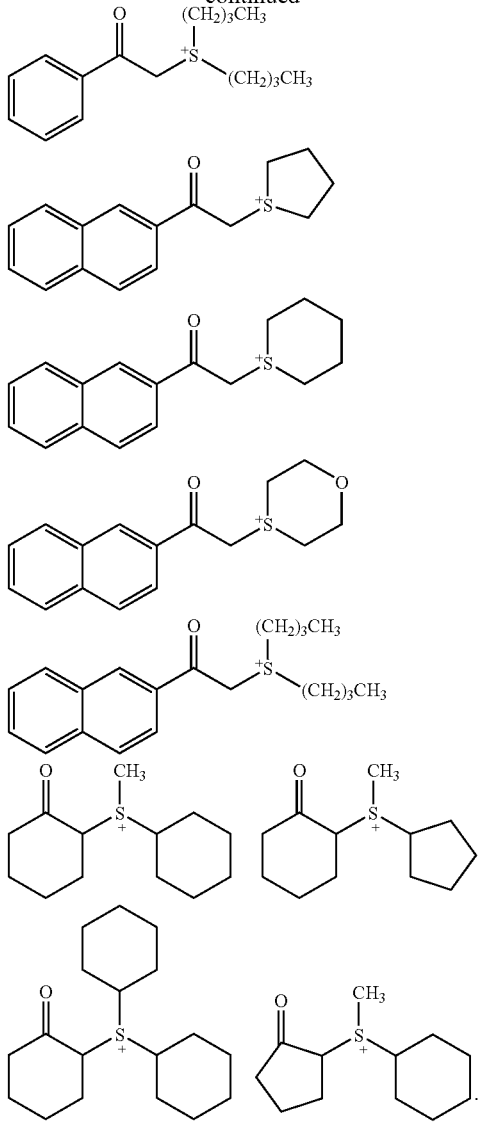

Specific examples of the organic counter ion represented by $Z^-$ include an anion represented by the following formula (VI):

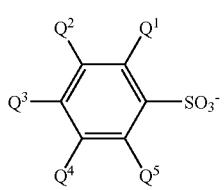

(VI)

wherein $Q^1$, $Q^2$, $Q^3$, $Q^4$ and $Q^5$ each independently represent a hydrogen atom, a halogen atom, a formyl group, a C1-C16 alkyl group, a C1-C16 alkoxy group, a C1-C8 halogenated alkyl group, a C6-C12 aryl group which may be substituted with at least one selected from a C1-C16 alkoxy group and a halogen atom, a C7-C12 aralkyl group which may be substituted with at least one selected from a C1-C16 alkoxy group and a halogen atom, a cyano group, a C1-C4 alkylthio group, a C1-C4 alkylsulfonyl group, a hydroxyl group, a nitro group or a group represented by the formula (VII):

 (VII)

wherein X represents an alkylene group and at least one —CH$_2$— except for —CH$_2$— bonding to —COO— in the alkylene group may be substituted by —O— or —S—, and Cy$^1$ represents a C3-C20 alicyclic hydrocarbon group.

Examples of the C1-C16 alkyl group include a methyl, ethyl, n-propyl, isopropyl, n-butyl, tert-butyl, n-pentyl, n-hexyl, n-octyl, n-decyl, n-dodecyl and n-hexadecyl group.

Examples of the C1-C16 alkoxy group include a methoxy, ethoxy, n-propoxy, isopropoxy, n-butoxy, tert-butoxy, n-pentyloxy, n-hexyloxy, isopentyloxy, n-decyloxy, n-dodecyloxy and n-hexadecyloxy group.

Examples of the halogen atom include a fluorine, chlorine, bromine and iodine atom.

Examples of the C1-C8 halogenated alkyl group include a trifluoromethyl, pentafluoroethyl, heptafluoropropyl and nonafluorobutyl group.

Examples of the C6-C12 aryl group which may be substituted with at least one selected from a C1-C16 alkoxy group and a halogen atom include a phenyl, tolyl, methoxyphenyl and naphthyl group.

Examples of the C7-C12 aralkyl group which may be substituted with at least one selected from a C1-C16 alkoxy group and a halogen atom include a benzyl, chlorobenzyl and methoxybenzyl group.

Examples of the C1-C4 alkylthio group include a methylthio, ethylthio, n-propylthio, isopropylthio and n-butylthio group.

Examples of the C1-C4 alkylsulfonyl group include a methylsulfonyl, ethylsulfonyl, n-propylsulfonyl, isopropylsulfonyl and n-butylsulfonyl group.

When two or more of Q$^1$, Q$^2$, Q$^3$, Q$^4$ and Q$^5$ are the groups represented by the formula (VII), the groups represented by the formula (VII) may be identical or different.

As the alkylene group represented by X, a C1-C12 alkylene group wherein at least one —CH$_2$— except for —CH$_2$— bonding to —COO— may be substituted by —O— or —S— is preferable, and more preferable examples include the followings:

—CH$_2$— (a-1)

—CH$_2$CH$_2$— (a-2)

—CH$_2$CH$_2$CH$_2$— (a-3)

—CH$_2$CH$_2$CH$_2$CH$_2$— (a-4)

—CH$_2$CH$_2$CH$_2$CH$_2$CH$_2$— (a-5)

—CH$_2$CH$_2$CH$_2$CH$_2$CH$_2$CH$_2$— (a-6)

—CH$_2$CH$_2$CH$_2$CH$_2$CH$_2$CH$_2$CH$_2$— (a-7)

—CH$_2$O— (a-8)

—CH$_2$OCH$_2$— (a-9)

—CH$_2$OCH$_2$CH$_2$— (a-10)

—CH$_2$CH$_2$OCH$_2$CH$_2$— (a-11)

—CH$_2$S— (a-12)

—CH$_2$SCH$_2$— (a-13)

—CH$_2$SCH$_2$CH$_2$— (a-14)

—CH$_2$CH$_2$SCH$_2$CH$_2$— (a-15)

Among them, the above-mentioned groups represented by the formulae (a-1) to (a-7) are especially preferred.

Examples of Cy$^1$ include the followings:

 (b-1)

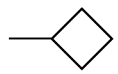 (b-2)

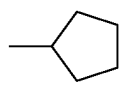 (b-3)

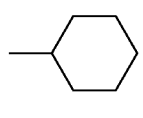 (b-4)

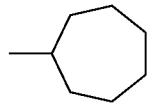 (b-5)

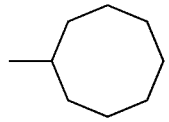 (b-6)

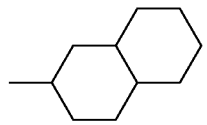 (b-11)

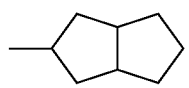 (b-12)

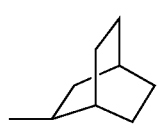 (b-13)

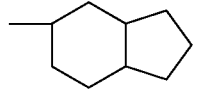 (b-14)

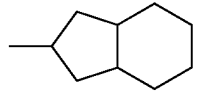 (b-15)

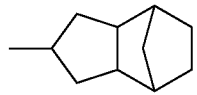 (b-16)

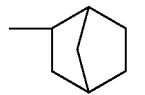 (b-21)

-continued
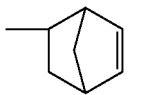 (b-22)
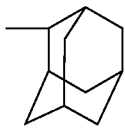 (b-23)
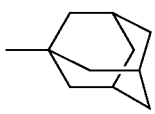 (b-24)
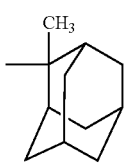 (b-25)
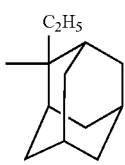 (b-26)
Among them, a C6-C12 alicyclic hydrocarbon group is preferred and the cyclohexyl (b-4), 2-norbornyl (b-21), 1-adamantyl (b-24) and 2-adamantyl (b-23) groups are more preferred.
Specific examples of the group represented by the formula (VII) include the followings:
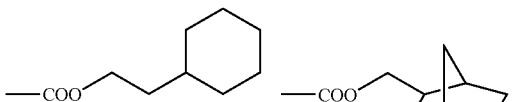
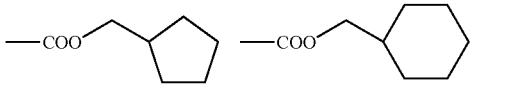
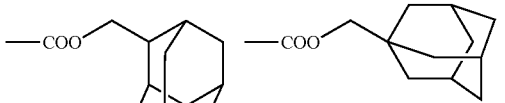
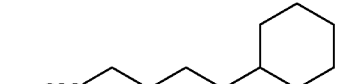
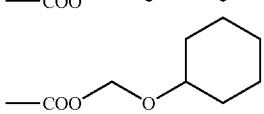
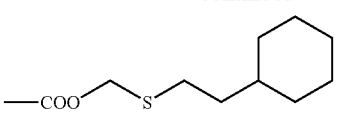
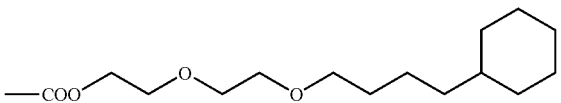
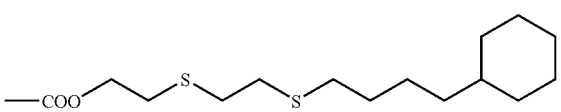
Examples of the anion represented by the formula (VI) include the followings:
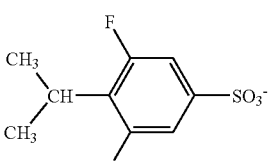
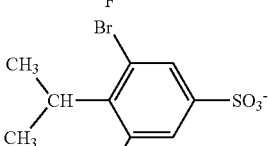
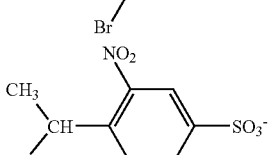
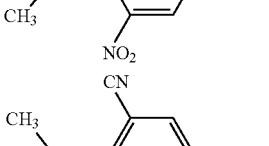
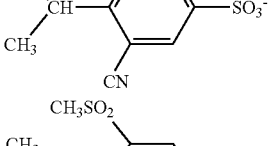
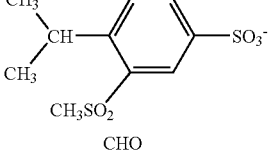
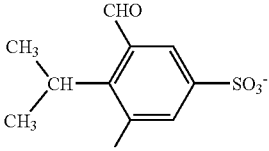
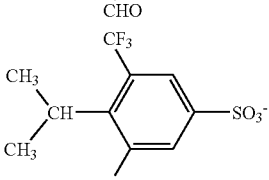
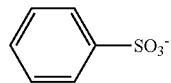

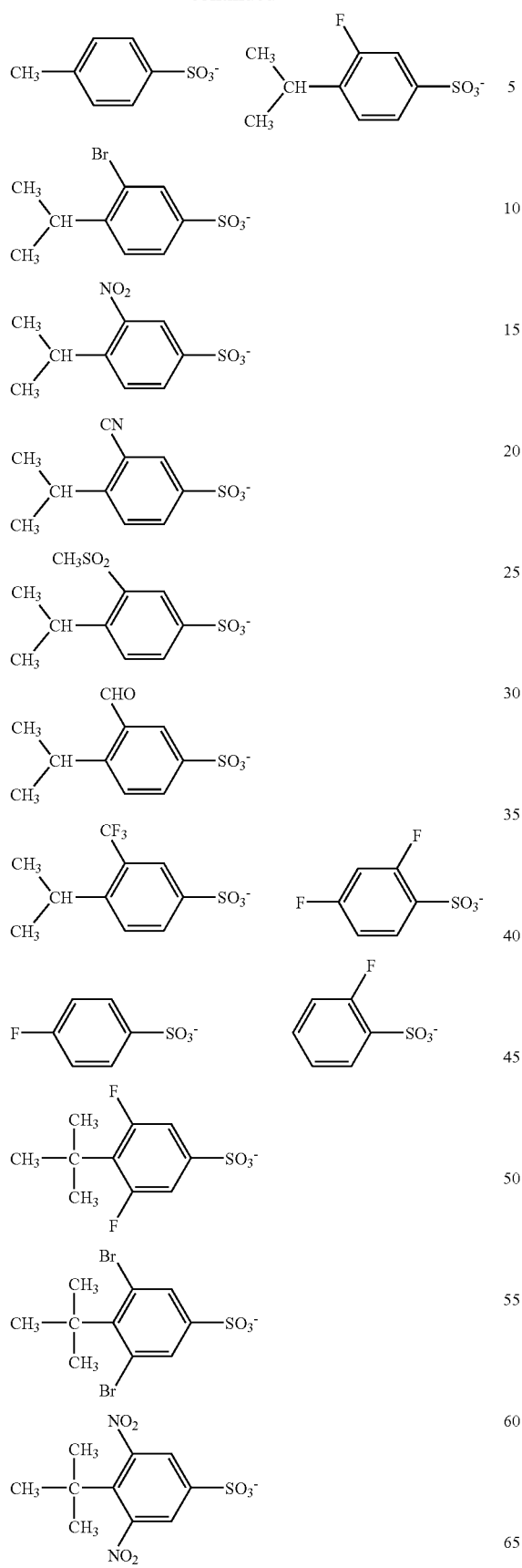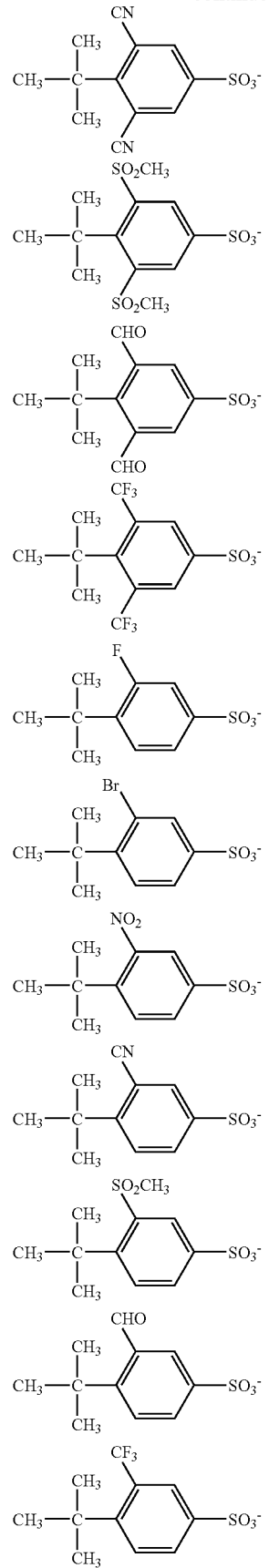

-continued
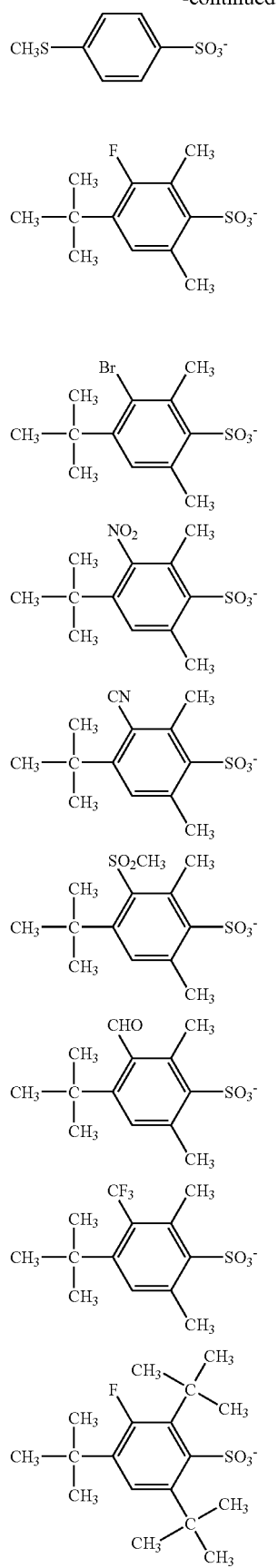
-continued
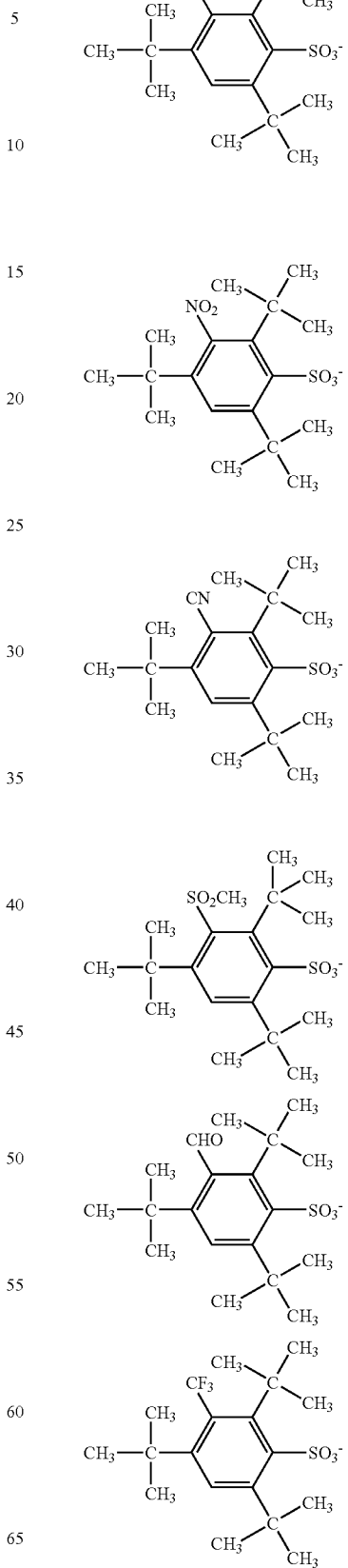

-continued
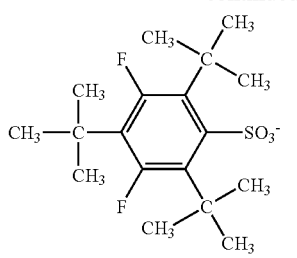
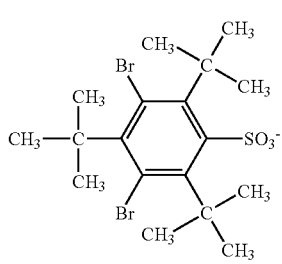
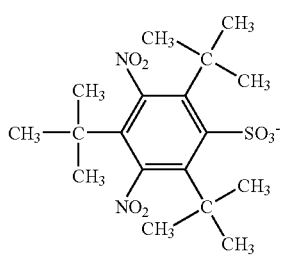
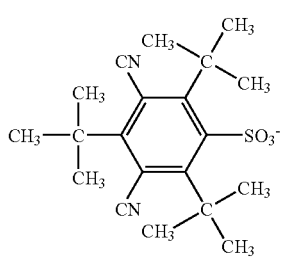
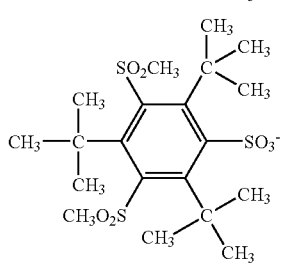
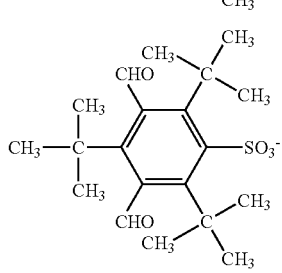
-continued
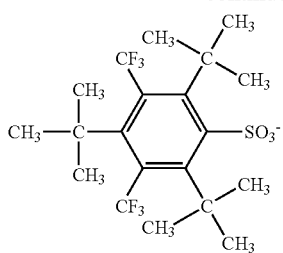
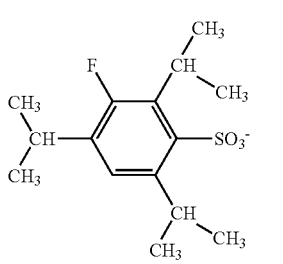
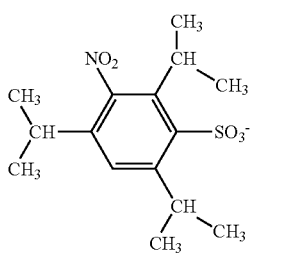
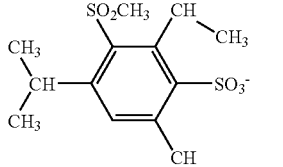
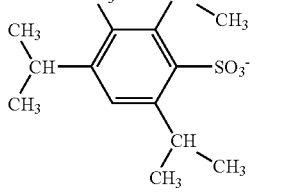
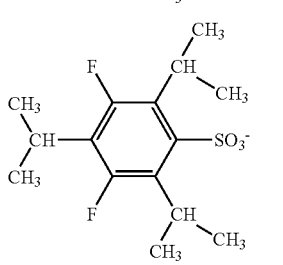

-continued
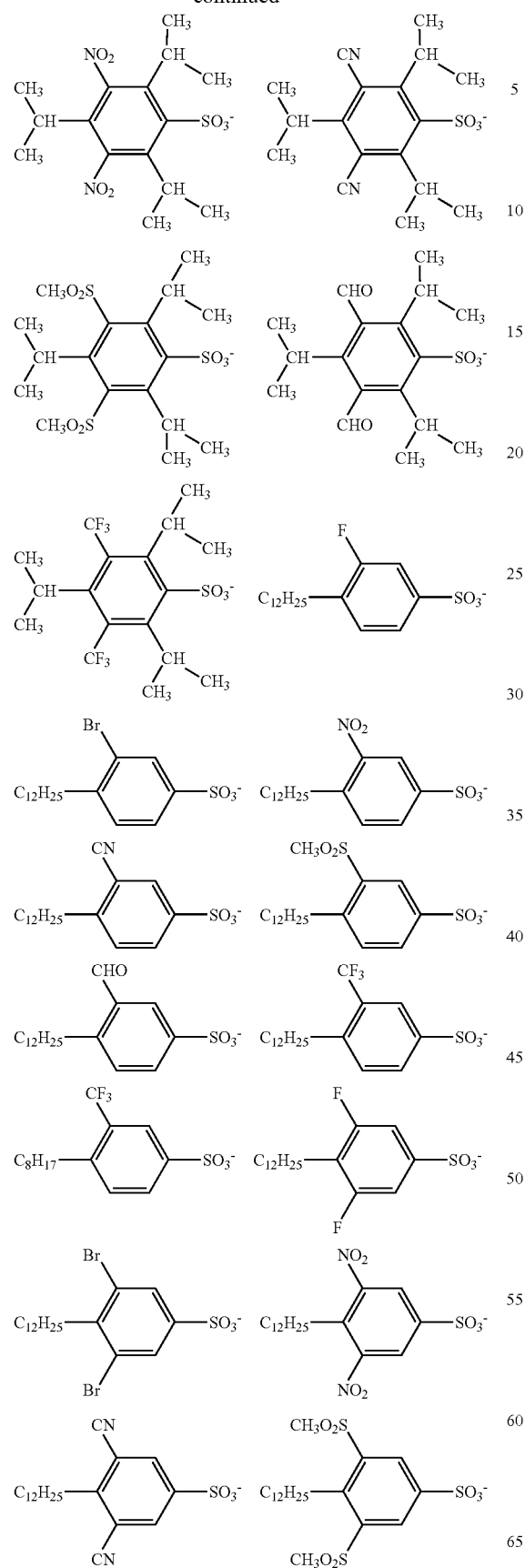
-continued
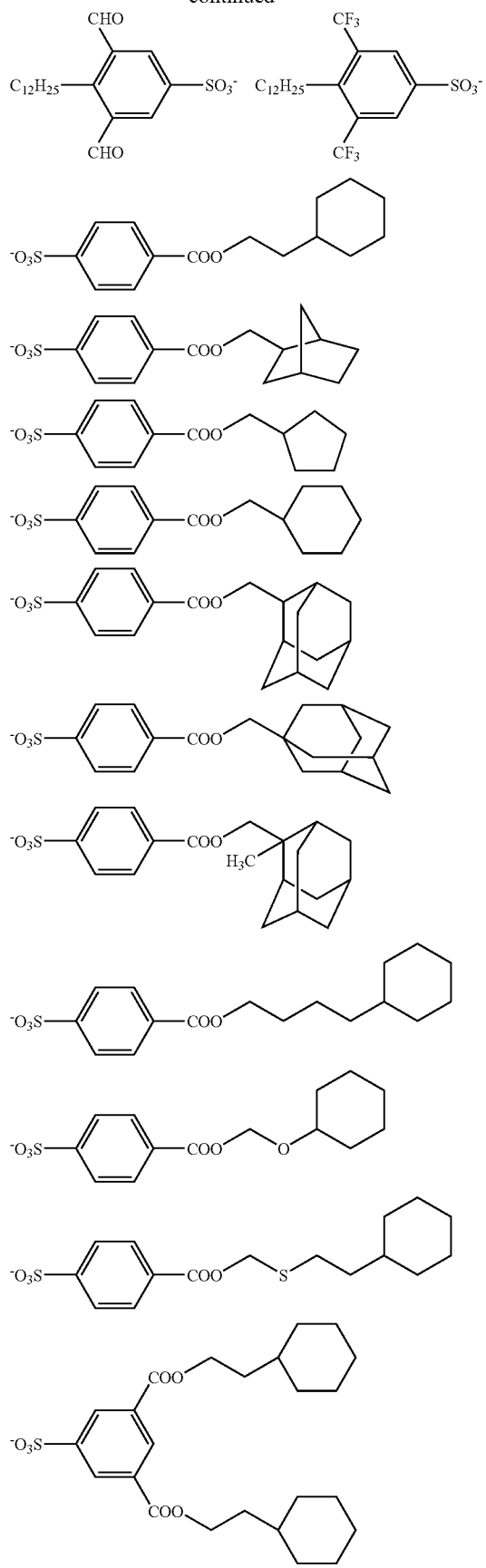

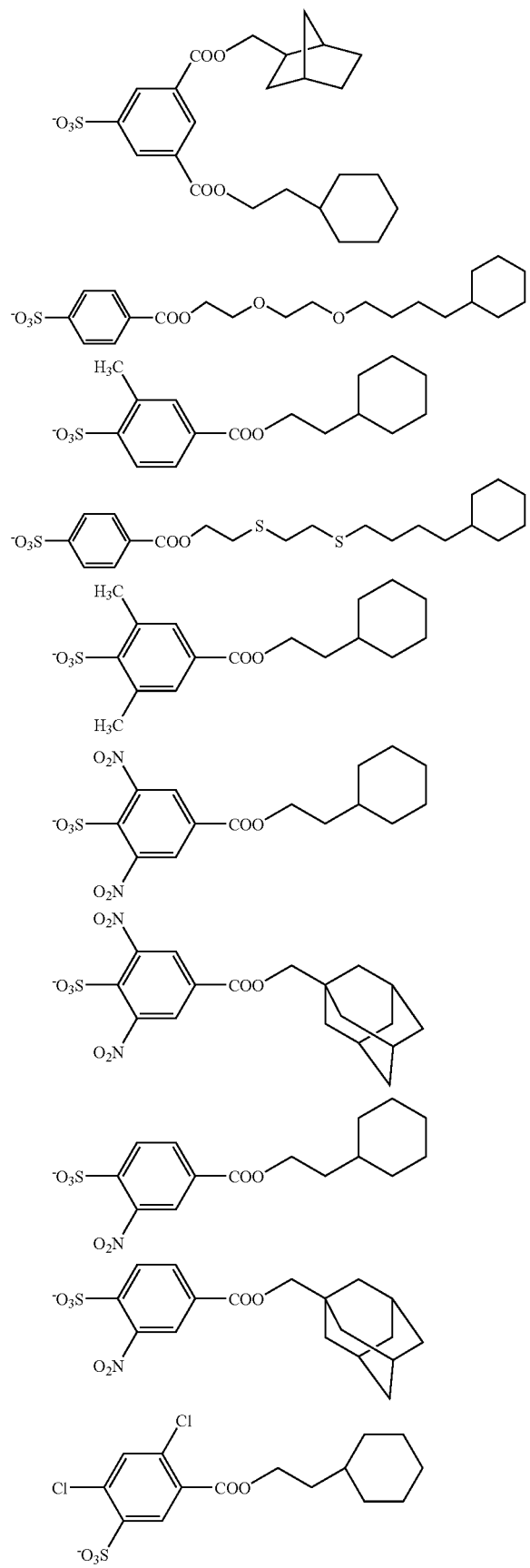
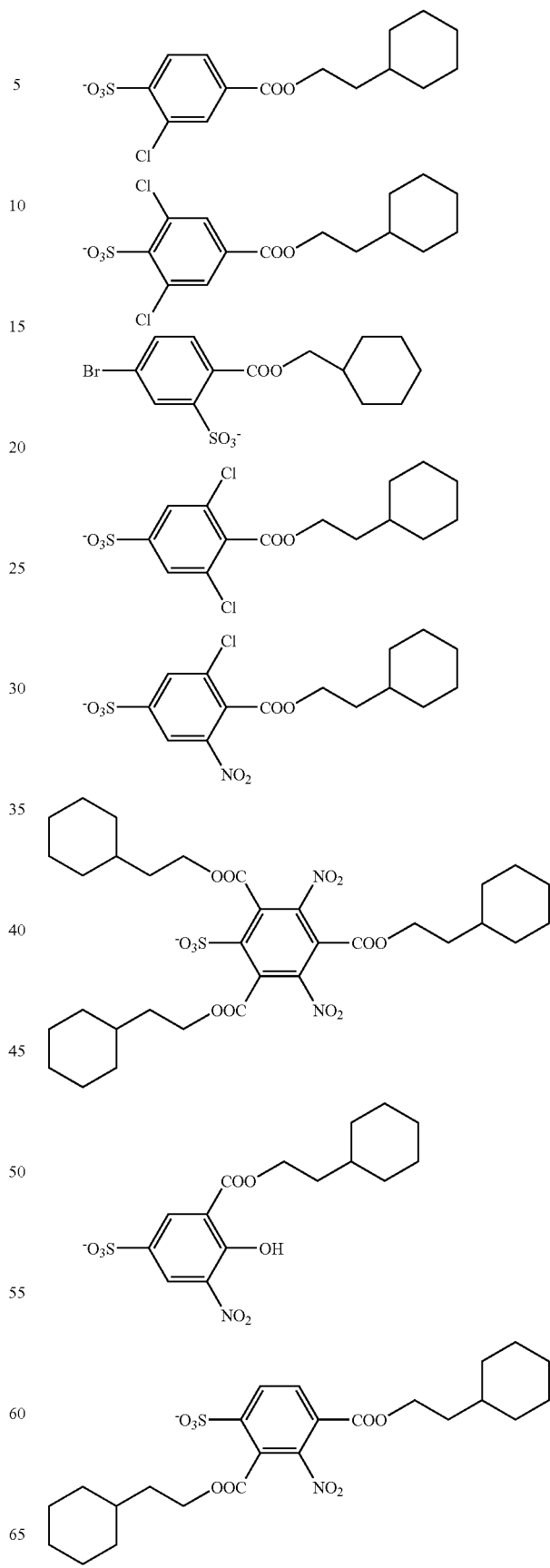

-continued

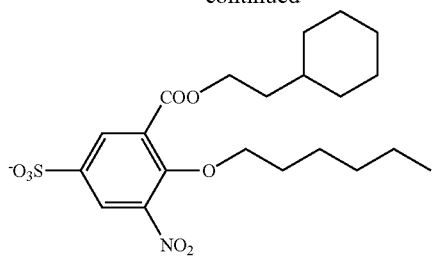

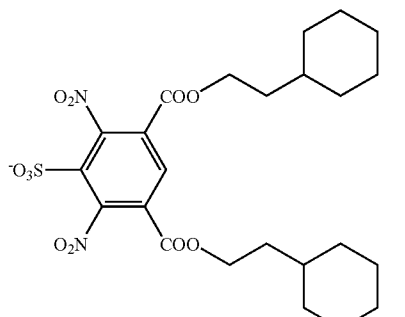

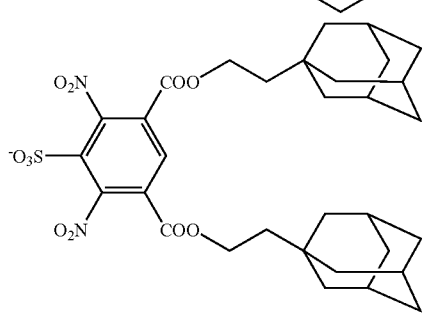

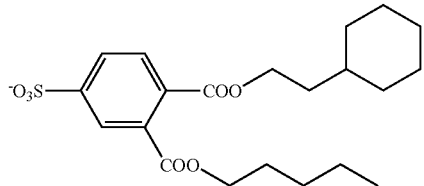

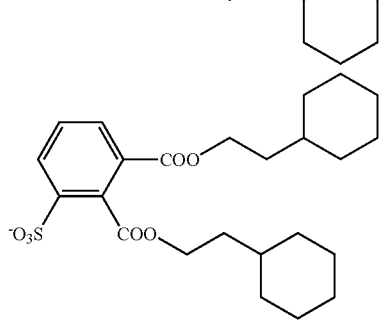

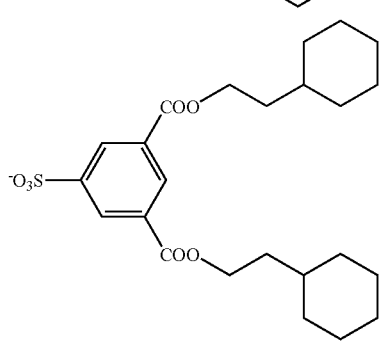

-continued

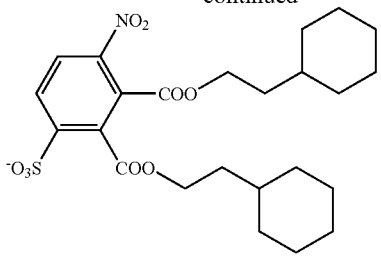

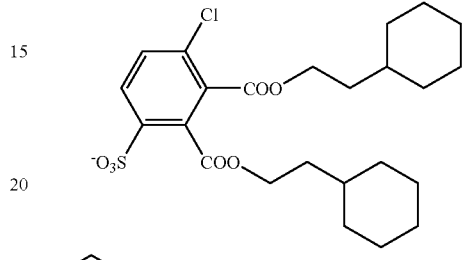

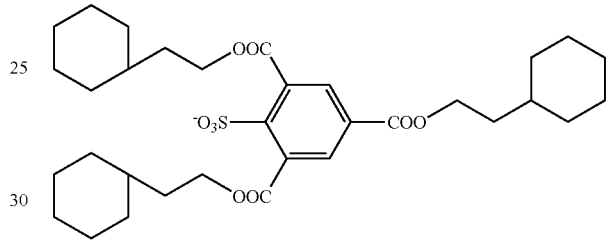

As the organic counter ion represented by the $Z^-$, an anion represented by the formula (VIIIa):

$$^-O_3S\text{-}Q^6 \quad \text{(VIIIa)}$$

wherein $Q^6$ represents a C1-C20 perfluoroalkyl group, a naphthyl group which may be substituted with a C1-C6 alkyl group or groups, or anthryl group which may be substituted with a C1-C6 alkyl group or groups, is also exemplified.

Examples of the anion represented by the formula (VIIIa) include a C1-C20 perfluoroalkylsulfonate anion and a naphthalenesulfonate anion which may be substituted with a C1-C6 alkyl group or groups.

Specific examples of the C1-C20 perfluoroalkylsulfonate anion include the followings:

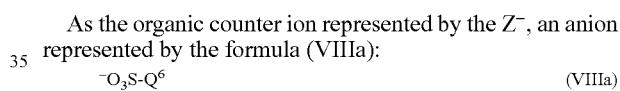

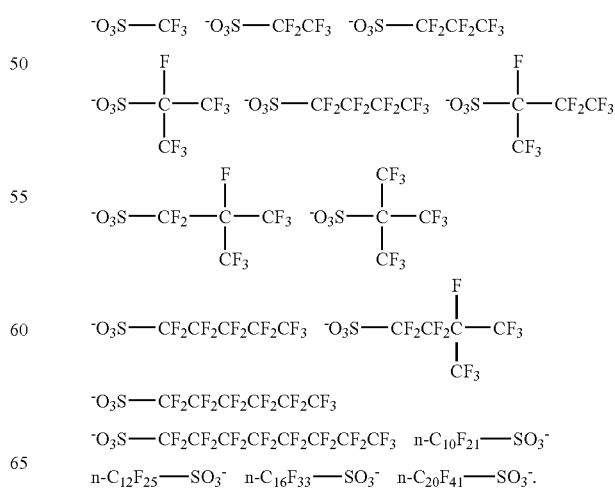

Specific examples of the naphthalenesulfonate anion which may be substituted with the C1-C6 alkyl group or groups include the followings:

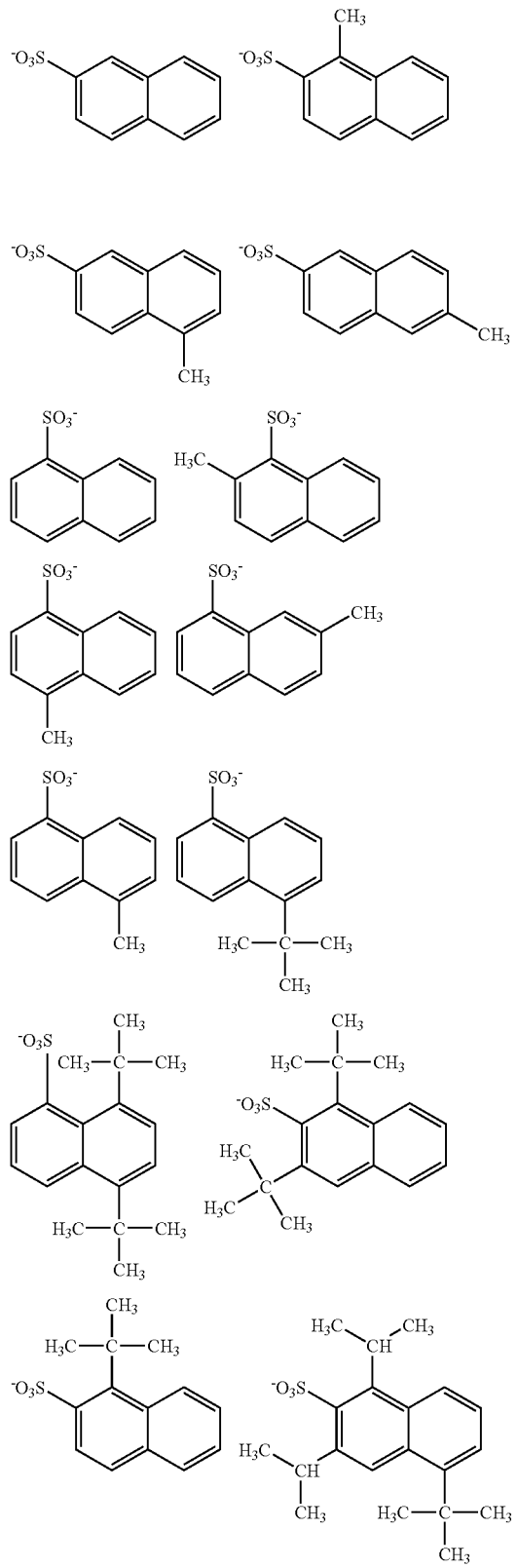

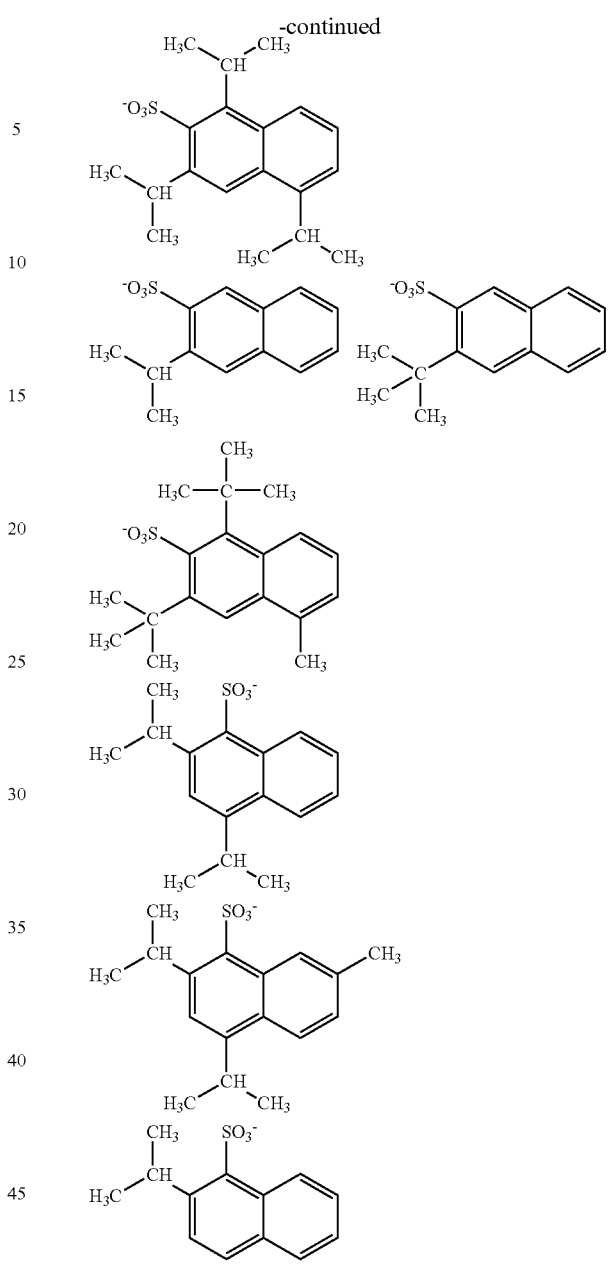

As the organic counter ion represented by the $Z^-$, an anion represented by the formula (VIIIb):

wherein $Q^7$ and $Q^8$ each independently represent a C1-C20 perfluoroalkyl group or a C6-C20 aromatic group which may be substituted, is also exemplified.

As the C1-C20 perfluoroalkyl group, the same groups as described above are exemplified. Examples of the C6-C20 aromatic group which may be substituted include a phenyl, 2-methylphenyl, 4-methylphenyl, 2,6-dimethylphenyl, 2-ethylphenyl, 4-ethylphenyl, 4-n-propylphenyl, 4-isopropylphenyl, 2,6-diisopropylphenyl, 4-methyl-2,6-diisopropylphenyl, 1-naphthyl, 2-naphthyl, 3-methyl-2-naphthyl, 3-ethyl-2-naphthyl, 1,3-dimethyl-2-naphthyl, 1,3-diisopropylnaphthyl, 6-methyl-1,3-diisopropylnaphthyl and 1,3,6-triisopropylnaphthyl group.

Examples of the anion represented by the formula (VIIIb) include the followings:

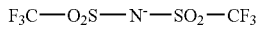
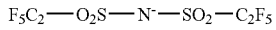
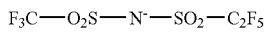
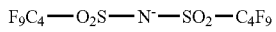
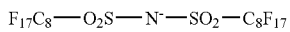
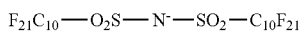
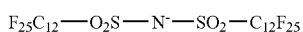
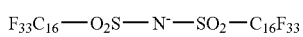
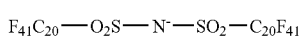
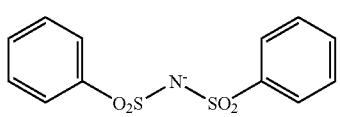
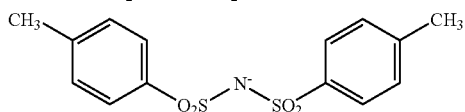
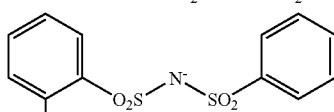
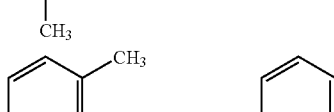
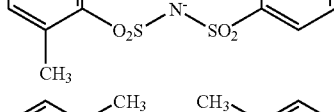
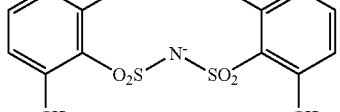
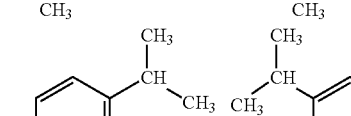
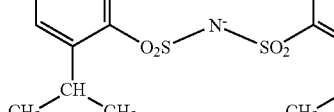
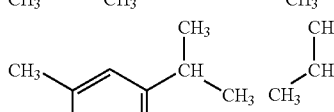
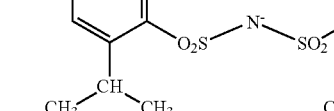
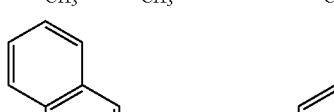
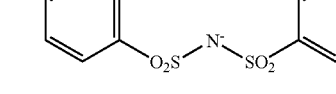

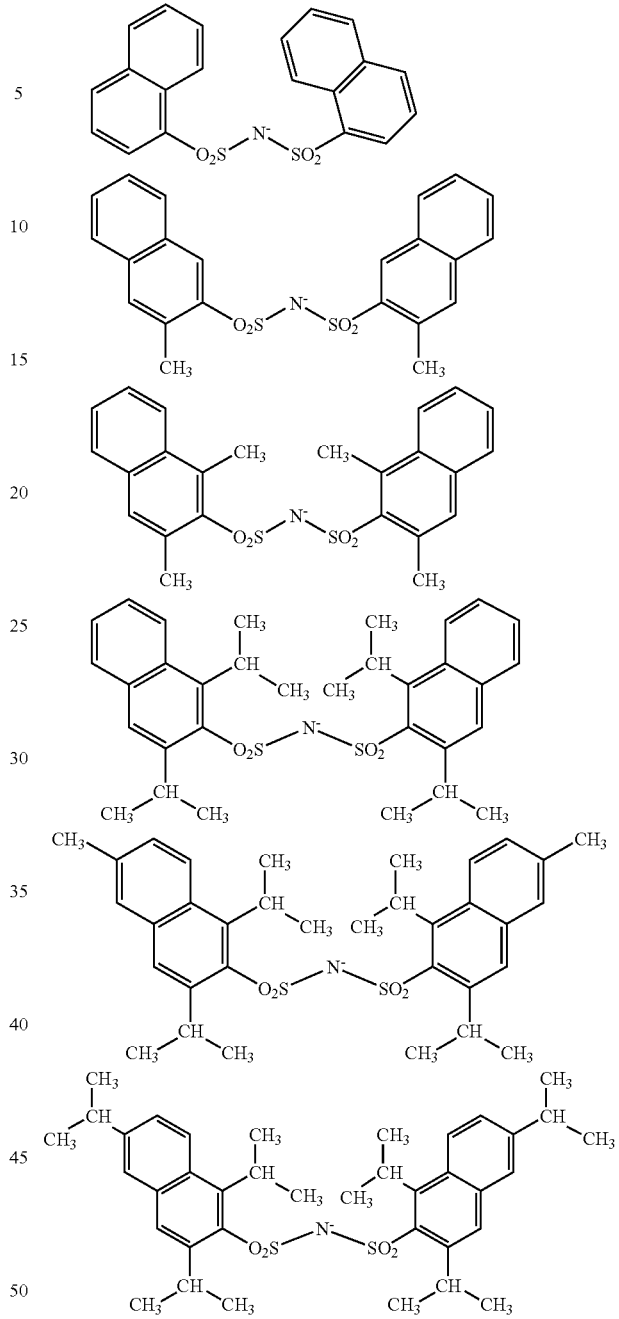

-continued

As the organic counter ion represented by the $Z^-$, the anion represented by the formula (VI) is preferable, and the anion represented by the formula (VI) wherein Q1, Q2, Q3, Q4 and Q5 each independently represent a hydrogen atom or a C1-C16 alkyl group is more preferable.

Examples of the halogenated alkyltriazine compound include 2-methyl-4,6-bis(trichloromethyl)-1,3,5-triazine, 2,4,6-tris(trichloromethyl)-1,3,5-triazine, 2-phenyl-4,6-bis(trichloromethyl)-1,3,5-triazine, 2-(4-chlorophenyl)-4,6-bis(trichloromethyl)-1,3,5-triazine, 2-(4-methoxyphenyl)-4,6-bis(trichloromethyl)-1,3,5-triazine, 2-(4-methoxy-1-naphthyl)-4,6-bis(trichloromethyl)-1,3,5-triazine, 2-(benzo[d][1,3]dioxoran-5-yl)-4,6-bis(trichloromethyl)-1,3,5-triazine, 2-(4-methoxystyryl)-4,6-bis(trichloromethyl)-1,3,5-triazine, 2-(3,4,5-trimethoxystyryl)-4,6-bis (trichloromethyl)-1,3,5-triazine, 2-(3,4-dimethoxystyryl)-4,6-bis(trichloromethyl)-1,3,5-triazine, 2-(2,4-methoxystyryl)-4,6-bis(trichloromethyl)-1,3,5-triazine, 2-(2-methoxystyryl)-4,6-bis(trichloromethyl)-1,3,5-triazine, 2-(4-butoxystyryl)-4,6-bis(trichloromethyl)-1,3,5-triazine and 2-(4-pentyloxystyryl)-4,6-bis(trichloromethyl)-1,3,5-triazine.

Examples of the sulfonate compound include 1-benzoyl-1-phenylmethyl p-toluenesulfonate (generally called "benzoin tosylate"), 2-benzoyl-2-hydroxy-2-phenylethyl p-toluenesulfonate (generally called "α-methylolbenzoin tosylate"), 1,2,3-benzene-tri-yl tris(methanesulfonate), 2,6-dinitrobenzyl p-toluenesulfonate, 2-nitrobenzyl p-toluenesulfonate and 4-nitrobenzyl p-toluenesulfonate.

Examples of the disulfone compound include diphenyl disulfone and di(p-tolyl) disulfone.

Examples of the diazomethane compound having a sulfonyl group include bis(phenylsulfonyl)diazomethane, bis(4-chlorophenylsulfonyl)diazomethane, bis(p-tolylsulfonyl)diazomethane, bis(4-tert-butylphenylsulfonyl)diazomethane, bis(2,4-xylylsulfonyl)diazomethane, bis(cyclohexylsulfonyl)diazomethane and (benzoyl)(phenylsulfonyl)diazomethane.

Examples of the imide compound having a sulfonyloxy group include N-(phenylsulfonyloxy)succinimide, N-(trifluoromethylsulfonyloxy)succinimide, N-(trifluoromethylsulfonyloxy)phthalimide, N-(trifluoromethylsulfonyloxy)-5-norbornene-2,3-dicarboxylmide, N-(trifluoromethylsulfonyloxy)naphthalimide and N-(10-camphorsulfonyloxy)naphthalimide.

The acid generator may be used alone or a mixture of two or more thereof may be used.

In the case of the exposure wavelength is in the range of 436 nm (g-rays) to 365 nm (i-rays), the following compound represented by the formula (IIIa) or (IIIb):

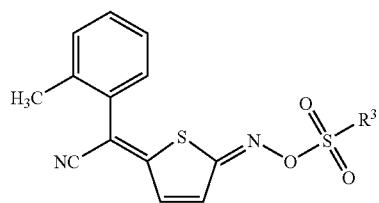

(IIIa)

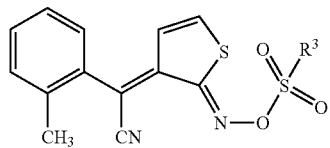

(IIIb)

wherein $R^3$ represents a hydrocarbon group which may have at least one selected from a substituent having an oxygen or nitrogen atom, and a halogen atom, is preferable as the acid generator.

Examples of the hydrocarbon group include a C1-C12 alkyl group such as a methyl, ethyl, n-propyl, n-butyl and n-octyl group; a C6-C18 aryl group such as a phenyl, tolyl, 2,4,6-trimethylphenyl, 2,4,6-triisopropylphenyl, 4-dodecylphenyl and 2-naphthyl group; a C7-C30 aralkyl group such as a benzyl group; and the like.

Examples of the substituent having an oxygen or nitrogen atom include an alkoxycarbonyl group, a hydroxyl group, an alkoxy group, an oxo group and a nitro group. Examples of the halogen atom include a fluorine, chlorine and bromine atom. Specific examples of the hydrocarbon group having at least one selected from a substituent having an oxygen or nitrogen atom, and a halogen atom include a 4-methoxyphenyl group, the following group:

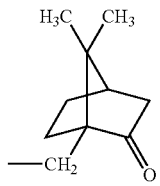

and the like.

As the compound represented by the formula (IIIa) or (IIIb), a commercially available one may be used and one produced by the method described in WO 99/01429 may be used.

The present chemically amplified positive resist composition may contain the other resin or resins in addition to the resin (A) and the acid generator.

Examples of the other resin include a resin which is soluble in an alkali aqueous solution and a resin which comprises a structural unit having an acid-labile group and which itself is insoluble or poorly soluble in an alkali aqueous solution but becomes soluble in an aqueous alkali solution by the action of an acid. As the other resin, the resin which is soluble in an alkali aqueous solution is preferable.

Specific examples of the resin which is soluble in an alkali aqueous solution include the above-mentioned novolak resin, the above-mentioned poly(hydroxystyrene), and a poly(hydroxystyrene) wherein a part of hydroxyl groups are protected by 1-alkoxyalkyl groups which may be substituted or 2-oxocycloalkyl groups.

Examples of the 1-alkoxyalkyl group which may be substituted include a 1-alkoxyxlkyl group which may be substituted with an alkoxy group or an acyloxy group. Examples of the alkoxy group include a C1-C12 linear, branched or cyclic alkoxy group such as methoxy, ethoxy, n-propoxy, isopropoxy, n-butoxy, tert-butoxy, n-hexyloxy, cyclohexyloxy and 1-adamantyloxy group. Examples the acyloxy group include a C2-C12 acyloxy group such as an acetyloxy, n-propionyloxy and 1-adamantanecarbonyloxy group.

Specific examples of the 1-alkoxyalkyl group which may be substituted include a 1-ethoxyethyl, 1-(2-methylpropoxy)ethyl, 1-cyclohexyloxyethyl, 1-(2-methoxyethoxy)ethyl, 1-(2-acetoxyethoxy)ethyl, 1-[2-(1-adamantyloxy)ethoxy]ethyl and 1-[2-(1-adamantanecarbonyloxy)ethoxy]ethyl group.

The poly(hydroxystyrene) wherein a part of hydroxyl groups are protected by 1-alkoxyalkyl groups which may be substituted or 2-oxocycloalkyl groups has acetal structures.

Specific examples thereof include a poly(hydroxystyrene) comprising a structural unit represented by the formula (Ia):

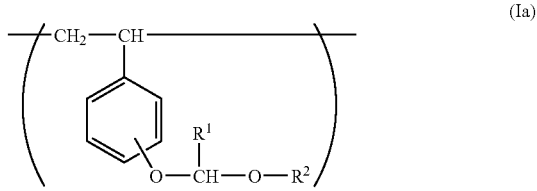

(Ia)

wherein R¹ represents a C1-C4 alkyl group and R² represents a C1-C6 alkyl group or a C5-C7 cycloalkyl group, or R¹ and R² are bonded to form a trimethylene group or a tetramethylene group, and a structural unit represented by the formula (Ib):

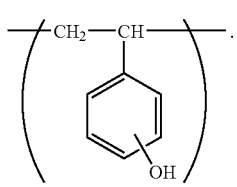

(Ib)

Preferable examples of the structural unit represented by the formula (Ia) include a structural unit represented by the formula (Ic):

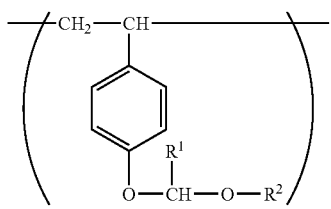

(Ic)

wherein R¹ and R² are the same as defined above, and preferable examples of the structural unit represented by the formula (Ib) is a structural unit represented by the formula (Id):

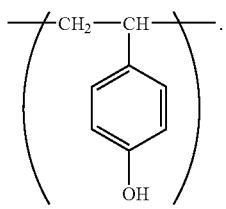

(Id)

Examples of the C1-C4 alkyl group represented by R¹ include a methyl, ethyl, n-propyl, isopropyl and n-butyl group, and the methyl group is preferable.

Examples of the C1-C6 alkyl group include a methyl, ethyl, n-propyl, isopropyl, n-butyl and n-hexyl group, and examples of the C5-C7 cycloalkyl group include a cylopentyl, cyclohexyl and cycloheptyl group. The ethyl, n-propyl and cyclohexyl groups are preferable and the cyclhexyl group is more preferable.

As the poly(hydroxystyrene) wherein a part of hydroxyl groups are protected by 1-alkoxyalkyl groups which may be substituted or 2-oxocycloalkyl groups, a poly(hydroxystyrene) wherein 10 to 90% of hydroxyl groups are protected by 1-alkoxyalkyl groups which may be substituted or 2-oxocycloalkyl groups is preferable, and a poly(hydroxystyrene) wherein 20 to 60% of hydroxyl groups are protected by 1-alkoxyalkyl groups which may be substituted or 2-oxocycloalkyl groups is more preferable.

The poly(hydroxystyrene) wherein a part of hydroxyl groups are protected by 1-alkoxyalkyl groups which may be substituted or 2-oxocycloalkyl groups can be produced by reacting the poly(hydroxystyrene) and the corresponding 1-alkoxyalkene in the presence of an acid catalyst.

Examples of the corresponding 1-alkoxyalkene include 1-ethoxyethene, 1-n-propoxyethene and 1-cyclohexyloxyethene. The ratio of the protected hydroxyl groups can be adjusted by adjusting the amount of the corresponding 1-alkoxyalkene. For example, in the case of producing the poly(hydroxystyrene) wherein 10 to 90% of hydroxyl groups are protected by 1-alkoxyalkyl groups which may be substituted or 2-oxocycloalkyl groups, 10 to 90% by mole of the corresponding 1-alkoxyalkene may be used relative to total moles of hydroxyl groups in the poly(hydroxystyrene).

Examples of the acid catalyst include an inorganic acid such as hydrochloric acid, sulfuric acid, perchloric acid and phosphoric acid; and an organic acid such as formic acid, acetic acid, oxalic acid, trichloroacetic acid and p-toluenesulonic acid. These acid catalysts may be used alone or two or more there of may be used in combination.

The amount of the acid catalyst is usually 0.0001 to 1% by weight relative to 1 part by weight of the poly(hydroxystyrene).

The reaction of the poly(hydroxystyrene) and the corresponding 1-alkoxyalkene is usually conducted by mixing the poly(hydroxystyrene), the corresponding 1-alkoxyalkene and the acid catalyst in a solvent. The solvent is not particularly limited in so far as it is an inert solvent on the reaction.

After completion of the reaction, for example, the poly (hydroxystyrene) wherein a part of hydroxyl groups are protected by 1-alkoxyalkyl groups which may be substituted or 2-oxocycloalkyl groups can be isolated, for example, by adding a basic compound such as triethylamine to the reaction mixture followed by washing the mixture obtained with water and then concentrating.

Examples of the acid-labile group include a structure having ester of carboxylic acid such as alkyl ester group in which a carbon atom adjacent to the oxygen atom is quaternary carbon atom, alicyclic ester group in which a carbon atom adjacent to the oxygen atom is quaternary carbon atom, and a lactone ester group in which a carbon atom adjacent to the oxygen atom is quaternary carbon atom. The "quaternary carbon atom" means a "carbon atom joined to four substituents other than hydrogen atom".

In the present specification, "—COOR" may be described as "a structure having ester of carboxylic acid", and may also be abbreviated as "ester group". Specifically, "—COOC (CH₃)₃" may be described as "a structure having tert-butyl ester of carboxylic acid", or be abbreviated as "tert-butyl ester group".

Examples of the acid-labile group include an alkyl ester group in which a carbon atom adjacent to the oxygen atom is quaternary carbon atom such as a tert-butyl ester group; an acetal type ester group such as a methoxymethyl ester, ethoxymethyl ester, 1-ethoxyethyl ester, 1-isobutoxyethyl ester, 1-isopropoxyethyl ester, 1-ethoxypropoxy ester, 1-(2-methoxyethoxy)ethyl ester, 1-(2-acetoxyethoxy)ethyl ester, 1-[2-(1-adamantyloxy)ethoxy]ethyl ester, 1-[2-(1-adamantanecarbonyloxy)ethoxy]ethyl ester, tetrahydro-2-furyl ester and tetrahydro-2-pyranyl ester group; an alicyclic ester group in which a carbon atom adjacent to the oxygen atom is quaternary carbon atom, such as an isobornyl ester, 1-alkylcycloalkyl ester, 2-alkyl-2-adamantyl ester and 1-(1-adamantyl)-1-alkylalkyl ester group. At least one hydrogen atom in the adamantyl group may be substituted with a hydroxyl group.

Examples of the structural unit include a structure unit derived from an ester of acrylic acid, a structural unit derived from an ester of methacrylic acid, a structural unit derived from an ester of norbornene carboxylic acid, a structural unit derived from an ester of tricyclodecenecarboxylic acid and a structural unit derived from an ester of tetracyclodecenecarboxylic acid. The structure units derived from the ester of acrylic acid and from the ester of methacrylic acid are preferable.

The resin used for the present composition can be obtained by conducting polymerization reaction of a monomer or monomers having the acid-labile group and an olefinic double bond.

Among the monomers, those having a bulky and acid-labile group such as an alicyclic ester group (e.g. a 2-alkyl-2-adamantyl ester and 1-(1-adamantyl)-1-alkylalkyl ester group) are preferable, since excellent resolution is obtained when the resin obtained is used in the present composition.

Examples of such monomer containing the bulky and acid-labile group include a 2-alkyl-2-adamantyl acrylate, a 2-alkyl-2-adamantyl methacrylate, 1-(1-adamantyl)-1-alkylalkyl acrylate, a 1-(1-adamantyl)-1-alkylalkyl methacrylate, a 2-alkyl-2-adamantyl 5-norbornene-2-carboxylate, a 1-(1-adamantyl)-1-alkylalkyl 5-norbornene-2-carboxylate, a 2-alkyl-2-adamantyl α-chloroacrylate and a 1-(1-adamantyl)-1-alkylalkyl α-chloroacrylate.

Particularly when the 2-alkyl-2-adamantyl acrylate, the 2-alkyl-2-adamantyl methacrylate or the 2-alkyl-2-adamantyl α-chloroacrylate is used as the monomer for the resin component in the present composition a resist composition having excellent resolution tends to be obtained. Typical examples thereof include 2-methyl-2-adamantyl acrylate, 2-methyl-2-adamantyl methacrylate, 2-ethyl-2-adamantyl acrylate, 2-ethyl-2-adamantyl methacrylate, 2-n-butyl-2-adamantylacrylate, 2-methyl-2-adamantylα-chloroacrylate and 2-ethyl-2-adamantyl α-chloroacrylate. When particularly 2-ethyl-2-adamantyl acrylate, 2-ethyl-2-adamantyl methacrylate, 2-isopropyl-2-adamantyl acrylate or 2-isopropyl-2-adamantyl methacrylate is used for the present composition, a resist composition having excellent sensitivity and heat resistance tends to be obtained. In the present invention, two or more kinds of monomers having a group or groups dissociated by the action of the acid may be used together, if necessary.

The 2-alkyl-2-adamantyl acrylate can be usually produced by reacting a 2-alkyl-2-adamantanol or a metal salt thereof with an acrylic halide, and the 2-alkyl-2-adamantyl methacrylate can be usually produced by reacting a 2-alkyl-2-adamantanol or a metal salt thereof with a methacrylic halide.

The present resist composition can also contain a resin containing a structural unit or units derived from an acid-stable monomer in addition to the above-mentioned structural units having the acid-labile group. Herein, the "structural unit derived from an acid-stable monomer" means "a structural unit not dissociated by an acid generated from the acid generator".

Examples of such other structural unit derived from the acid-stable monomer include a structural unit derived from a monomer having a free carboxyl group such as acrylic acid and methacrylic acid; a structural unit derived from an aliphatic unsaturated dicarboxylic anhydride such as maleic anhydride and itaconic anhydride; a structural unit derived from 2-norbornene; a structural unit derived from acrylonitrile or methacrylonitrile; a structural unit derived from an alkyl acrylate or an alkyl methacrylate in which a carbon atom adjacent to oxygen atom is secondary or tertiary carbon atom; a structural unit derived from 1-adamantyl acrylate or 1-adamantyl methacrylate; a structural unit derived from styrene monomer such as p-hydroxystyrene and m-hydroxystyrene; a structural unit derived from acryloyloxy-γ-butyrolactone or methacryloyloxy-γ-butyrolactone having a lactone ring which may be substituted with an alkyl group; and the like. Herein, the 1-adamantyloxycarbonyl group is the acid-stable group though the carbon atom adjacent to oxygen atom is the quaternary carbon atom, and the 1-adamantyloxycarbonyl group may be substituted with at least one hydroxyl group.

Specific examples of the structural unit derived from the acid-stable monomer include a structural unit derived from 3-hydroxy-1-adamantyl acrylate;
a structural unit derived from 3-hydroxy-1-adamantyl methacrylate;
a structural unit derived from 3,5-dihydroxy-1-adamantyl acrylate;
a structural unit derived from 3,5-dihydroxy-1-adamantyl methacrylate;
a structural unit derived from α-acryloyloxy-γ-butyrolactone;
a structural unit derived from α-methacryloyloxy-γ-butyrolactone;
a structural unit derived from β-acryloyloxy-γ-butyrolactone;
a structural unit derived from β-methacryloyloxy-γ-butyrolactone;
a structural unit represented by the formula (X):

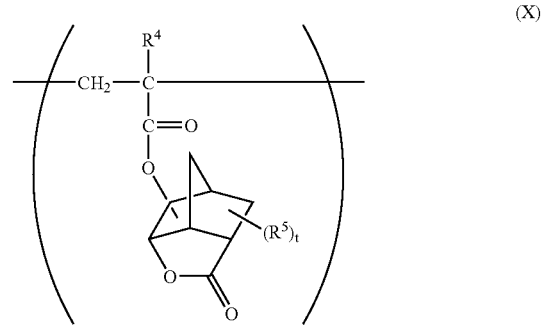

wherein $R^4$ represents a hydrogen atom or a methyl group, $R^9$ represents a methyl group, a trifluoromethyl group or a halogen atom, t represents an integer of 0 to 3, and when t represents 2 or 3, $R^5$s may be the same or different each other;
a structural unit represented by the formula (XI):

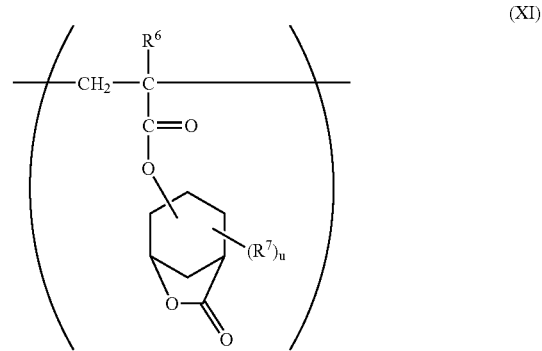

wherein $R^6$ represents a hydrogen atom or a methyl group, $R^7$ represents a methyl group, a trifluoromethyl group or a halogen atom, u represents an integer of 0 to 3, and when u represents 2 or 3, $R^7$s may be the same or different each other;
a structural unit derived from p-hydroxystyrene;
a structural unit derived from m-hydroxystyrene;

a structural unit derived from an alicyclic compound having an olefinic double bond such as a structural unit represented by the formula (XII):

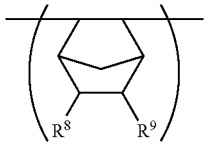

(XII)

wherein $R^8$ and $R^9$ each independently represents a hydrogen atom, a C1-C3 alkyl group, a C1-C3 hydroxyalkyl group, a carboxyl group, a cyano group or a —COOU group in which U represents an alcohol residue, or $R^8$ and $R^9$ can be bonded together to form a carboxylic anhydride residue represented by —C(=O)OC(=O)—;
a structural unit derived from an aliphatic unsaturated dicarboxylic anhydride such as a structural unit represented by the formula (XIII):

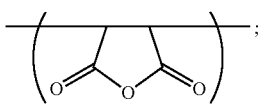

(XIII)

a structural unit represented by the formula (XIV):

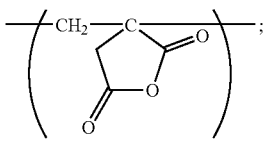

(XIV)

and the like.

Particularly, the resin having further at least one structural unit selected from the structural unit derived from p-hydroxystyrene, the structural unit derived from m-hydroxystyrene, the structural unit derived from 3-hydroxy-1-adamantyl acrylate, the structural unit derived from 3-hydroxy-1-adamantyl methacrylate, the structural unit derived from 3,5-dihydroxy-1-adamantyl acrylate, the structural unit derived from 3,5-dihydroxy-1-adamantyl methacrylate, the structural unit represented by the formula (X) and the structural unit represented by the formula (XI) in addition to the structural unit having the acid-labile group is preferable from the standpoint of the adhesiveness of resist to a substrate and resolution of resist.

3-Hydroxy-1-adamantyl acrylate, 3-hydroxy-1-adamantyl methacrylate, 3,5-dihydroxy-1-adamantyl acrylate and 3,5-dihydroxy-1-adamantyl methacrylate can be produced, for example, by reacting corresponding hydroxyadamantane with acrylic acid, methacrylic acid or its acid halide, and they are also commercially available.

Further, the acryloyloxy-γ-butyrolactone and the methacryloyloxy-γ-butyrolactone having the lactone ring which may be substituted with the alkyl group can be produced by reacting corresponding α- or β-bromo-γ-butyrolactone with acrylic acid or methacrylic acid, or reacting corresponding α- or β-hydroxy-γ-butyrolactone with the acrylic halide or the methacrylic halide.

As monomers to give structural units represented by the formulae (X) and (XI), specifically listed are, for example, an acrylate of alicyclic lactones and a methacrylate of alicyclic lactones having the hydroxyl group described below, and mixtures thereof. These esters can be produced, for example, by reacting the corresponding alicyclic lactone having the hydroxyl group with acrylic acid or methacrylic acid, and the production method thereof is described in, for example, JP 2000-26446 A.

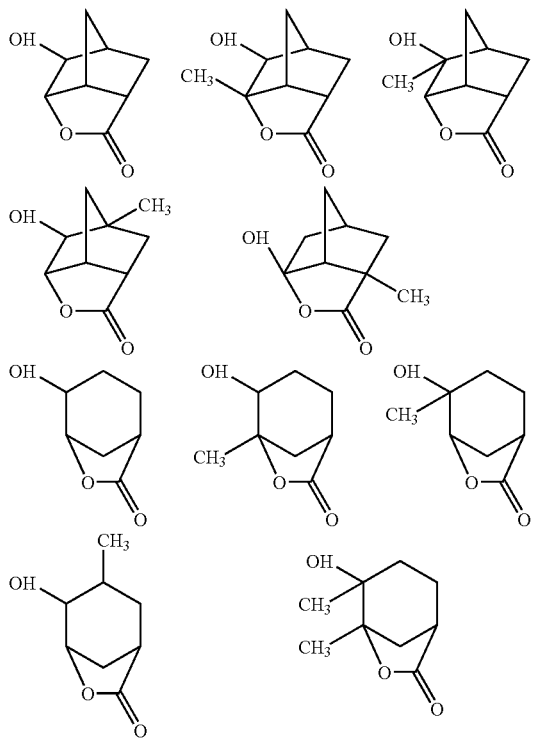

Examples of the acryloyloxy-γ-butyrolactone and the methacryloyloxy-γ-butyrolactone having the lactone ring which may be substituted with the alkyl group include α-acryloyloxy-γ-butyrolactone, α-methacryloyloxy-γ-butyrolactone, α-acryloyloxy-β,β-dimethyl-γ-butyrolactone, α-methacryloyloxy-β,β-dimethyl-γ-butyrolactone, α-acryloyloxy-α-methyl-γ-butyrolactone, α-methacryloyloxy-α-methyl-γ-butyrolactone, β-acryloyloxy-γ-butyrolactone, β-methacryloyloxy-γ-butyrolactone and β-methacryloyloxy-α-methyl-γ-butyrolactone.

In the case of KrF lithography, even in the case of using a structure unit derived from hydroxystyrene such as p-hydroxystyrene and m-hydroxystyrene, as one of components of the resin, a resist composition having sufficient transparency can be obtained. For obtaining such copolymerization resins, the corresponding acrylic or methacrylic ester monomer can be radical-polymerized with acetoxystyrene and styrene, and then the acetoxy group in the structure unit derived from acetoxystyrene can be de-acetylated with an acid.

The resin containing a structural unit derived from 2-norbornene shows strong structure because the alicyclic group is directly present on its main chain and shows a property that dry etching resistance is excellent. The structural unit derived from 2-norbornene can be introduced into the main chain by radical polymerization using, for example, an aliphatic unsaturated dicarboxylic anhydride such as maleic anhydride and itaconic anhydride together in addition to corresponding 2-norbornene. The structural unit derived from 2-norbornene is formed by opening of its double bond, and can be represented by the above-mentioned formula (XII). The structural unit derived from maleic anhydride and from itaconic anhydride which are the structural unit derived from aliphatic unsaturated dicarboxylic anhydrides are formed by opening of their double bonds, and can be represented by the above-mentioned formula (XIII) and the formula (XIV), respectively.

In $R^8$ and $R^9$, examples of the C1-C3 alkyl group include a methyl, ethyl, and n-propyl group, and examples of the C1-C3 hydroxyalkyl group include a hydroxymethyl and 2-hydroxyethyl group.

In $R^8$ and $R^9$, the —COOU group is an ester formed from the carboxyl group, and as the alcohol residue corresponding to U, for example, an optionally substituted C1-C8 alkyl group, 2-oxooxolan-3-yl group, 2-oxooxolan-4-yl and the like are listed, and as the substituent on the C1-C8 alkyl group, a hydroxyl group, an alicyclic hydrocarbon residue and the like are listed.

Specific examples of the monomer used to give the structural unit represented by the above-mentioned formula (XII) may include 2-norbornene, 2-hydroxy-5-norbornene, 5-norbornene-2-carboxylic acid, methyl 5-norbornene-2-carboxylate, 2-hydroxyethyl 5-norbornene-2-carboxylate, 5-norbornene-2-methanol and 5-norbornene-2,3-dicarboxylic anhydride.

When U in the —COOU group is the acid-labile group, the structural unit represented by the formula (XII) is a structural unit having the acid-labile group even if it has the norbornene structure. Examples of monomers giving structural unit having the acid-labile group include tert-butyl 5-norbornene-2-carboxylate, 1-cyclohexyl-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, and the like.

The resin used in the present composition preferably contains the structural unit or units having the acid-labile group generally in a ratio of 10 to 80% by mole in all structural units of the resin though the ratio varies depending on the kind of radiation for patterning exposure, the kind of the acid-labile group, and the like.

When the structural units particularly derived from the 2-alkyl-2-adamantyl acrylate, the 2-alkyl-2-adamantyl methacrylate, the 1-(1-adamantyl)-1-alkylalkyl acrylate or the 1-(1-adamantyl)-1-alkylalkyl methacrylate are used as the structural unit having the acid-labile group, it is advantageous in dry-etching resistance of the resist that the ratio of the structural units is 15% by mole or more in all structural units of the resin.

When, in addition to structural units having the acid-labile group, other structural units having the acid-stable group are contained in the resin, it is preferable that the sum of these structural units is in the range of 20 to 90% by mole based on all structural units of the resin.

The resin used for the present resist composition can be produced by conducting the polymerization reaction of the corresponding monomer or monomers. The resin can also be produced by conducting the oligomerization reaction of the corresponding monomer or monomers followed by conducting the polymerization reaction of the oligomer obtained.

The polymerization reaction is usually carried out in the presence of a radical initiator.

The radical initiator is not limited and examples thereof include an azo compound such as 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile), 2,2'-azobis(2,4-dimethyl-4-methoxyvaleronitrile), dimethyl-2,2'-azobis(2-methylpropionate) and 2,2'-azobis(2-hydroxymethylpropionitrile); an organic hydroperoxide such as lauroyl peroxide, tert-butyl hydroperoxide, benzoyl peroxide, tert-butyl peroxybenzoate, cumene hydroperoxide, diisopropyl peroxydicarbonate, di-n-propyl peroxydicarbonate, tert-butyl peroxyneodecanoate, tert-butyl peroxypivalate and 3,5,5-trimethylhexanoyl peroxide; and an inorganic peroxide such as potassium peroxodisulfate, ammonium peroxodisulfate and hydrogen peroxide. Among them, the azo compound is preferable and 2,2'-azobisisobutyronitrile, 2,2'-azobis(2-methylbutyronitrile), 1,1'-azobis(cyclohexane-1-carbonitrile), 2,2'-azobis(2,4-dimethylvaleronitrile) and dimethyl-2,2'-azobis(2-methylpropionate) are more preferable, and 2,2'-azobisisobutyronitrile and 2,2'-azobis(2,4-dimethylvaleronitrile) are especially preferable.

These radical initiators may be used alone or in a form of a mixture of two or more kinds thereof. When the mixture of two or more kinds thereof is used, the mixed ratio is not particularly limited.

The amount of the radical initiator is preferably 1 to 20% by mole based on all monomer or oligomer molar amount.

The polymerization temperature is usually 0 to 150° C., and preferably 40 to 100° C.

The polymerization reaction is usually carried out in the presence of a solvent and it is preferred to use a solvent which is sufficient to dissolve the monomer, the radical initiator and the resin obtained. Examples thereof include a hydrocarbon solvent such as toluene; an ether solvent such as 1,4-dioxane and tetrahydrofuran; a ketone solvent such as methyl isobutyl ketone; an alcohol solvent such as isopropyl alcohol; a cyclic ester solvent such as γ-butyrolactone; a glycol ether ester ester solvent such as propylene glycol monomethyl ether acetate; and an acyclic ester solvent such as ethyl lactate. These solvents may be used alone and a mixture thereof may be used.

The amount of the solvent is not limited, and practically, it is preferably 1 to 5 parts by weight relative to 1 part of all monomers or oligomers.

When an alicyclic compound having an olefinic double bond and an aliphatic unsaturated dicarboxylic anhydride are used as monomers, it is preferable to use them in excess amount in view of a tendency that these are not easily polymerized.

After competition of the polymerization reaction, the resin produced can be isolated, for example, by adding a solvent in which the present resin is insoluble or poorly soluble to the reaction mixture obtained and filtering the precipitated resin. If necessary, the isolated resin may be purified, for example, by washing with a suitable solvent.

It is preferable that the present resist composition contains resin component in an amount of about 90 to 99.9% by weight and the acid generator in an amount of 0.1 to 10% by weight on the total amount of the resin component and the acid generator. Herein, "resin component" means the resin (A) and the other resin or resins contained in the present resist composition.

The amount of the resin (A) is preferably 20 to 100% by weight and more preferably 25 to 100% by weight on the total amount of the resin component.

In the present resist composition, performance deterioration caused by inactivation of acid which occurs due to post exposure delay can be diminished by adding an organic base compound, particularly a nitrogen-containing organic base compound as a quencher.

Specific examples of the nitrogen-containing organic base compound include an amine compound represented by the following formulae:

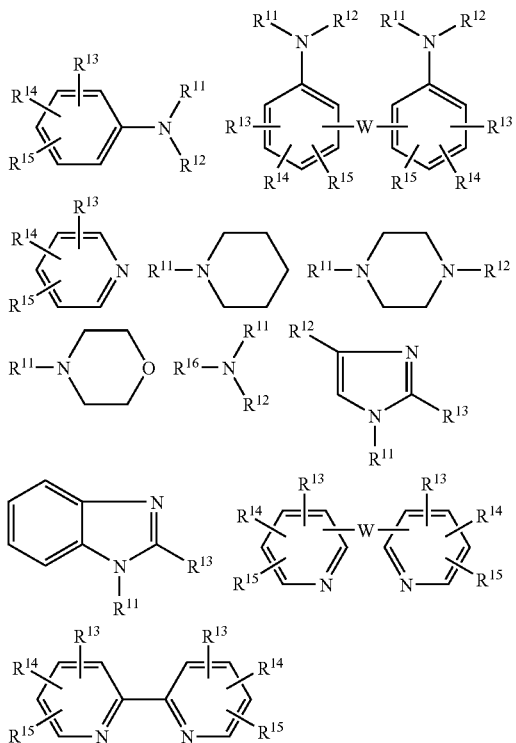

wherein $R^{11}$ and $R^{12}$ independently represent a hydrogen atom, an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group which may be substituted with a C1-C6 alkoxy group, $R^{13}$ and $R^{14}$ independently represent a hydrogen atom, an alkyl group, a cycloalkyl group, an aryl group or an alkoxy group, and the alkyl, cycloalkyl, aryl and alkoxy group may be substituted with at least one group selected from a hydroxyl group, an amino group which may be substituted with a C1-C4 alkyl group and a C1-C6 alkoxy group, or $R^{13}$ and $R^{14}$ bond together with the carbon atoms to which they bond to form an aromatic ring, $R^{15}$ represent a hydrogen atom, an alkyl group, a cycloalkyl group, an aryl group, an alkoxy group or a nitro group, and the alkyl, cycloalkyl, aryl and alkoxy group which may be substituted with at least one group selected from a hydroxyl group, an amino group which may be substituted with a C1-C4 alkyl group and a C1-C6 alkoxy group, $R^{16}$ represents an alkyl or cycloalkyl group, and the alkyl and cycloalkyl group may be substituted with at least one group selected from a hydroxyl group, an amino group which may be substituted with a C1-C4 alkyl group and a C1-C6 alkoxy group, and W represents —CO—, —NH—, —S—, —S—S—, an alkylene group of which at least one methylene group may be replaced with —O—, or an alkenylene group of which at least one methylene group may be replaced with —O—, and a quaternary ammonium hydroxide represented by the following formula:

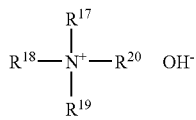

wherein $R^{17}$, $R^{18}$, $R^{19}$ and $R^{20}$ independently represent an alkyl group, a cycloalkyl group or an aryl group, and the alkyl, cycloalkyl and aryl group may be substituted with at least one group selected from a hydroxyl group, an amino group which may be substituted with a C1-C4 alkyl group and a C1-C6 alkoxy group.

The alkyl group in $R^{11}$, $R^{12}$, $R^{13}$, $R^{14}$, $R^{15}$, $R^{16}$, $R^{17}$, $R^{18}$, $R^{19}$ and $R^{20}$ preferably has about 1 to 10 carbon atoms, and more preferably has about 1 to 6 carbon atoms.

Examples of the amino group which may be substituted with the C1-C4 alkyl group include an amino, methylamino, ethylamino, n-butylamino, dimethylamino and diethylamino group. Examples of the C1-C6 alkoxy group which may be substituted with the C1-C6 alkoxy group include a methoxy, ethoxy, n-propoxy, isopropoxy, n-butoxy, tert-butoxy, n-pentyloxy, n-hexyloxy and 2-methoxyethoxy group.

Specific examples of the alkyl group which may be substituted with at least one group selected from a hydroxyl group, an amino group which may be substituted with a C1-C4 alkyl group, and a C1-C6 alkoxy group which may be substituted with a C1-C6 alkoxy group include a methyl, ethyl, n-propyl, isopropyl, n-butyl, tert-butyl, n-pentyl, n-hexyl, n-octyl, n-nonyl, n-decyl, 2-(2-methoxyethoxy)ethyl, 2-hydroxyethyl, 2-hydroxypropyl, 2-aminoethyl, 4-aminobutyl and 6-aminohexyl group.

The cycloalkyl group in $R^{11}$, $R^{12}$, $R^{13}$, $R^{14}$, $R^{15}$, $R^{16}$, $R^{17}$, $R^{18}$, $R^{19}$ and $R^{20}$ preferably has about 5 to 10 carbon atoms. Specific examples of the cycloalkyl group which may be substituted with at least one group selected from a hydroxyl group, an amino group which may be substituted with a C1-C4 alkyl group and a C1-C6 alkoxy group include a cyclopentyl, cyclohexyl, cycloheptyl and cyclooctyl group.

The aryl group in $R^{11}$, $R^{12}$, $R^{13}$, $R^{14}$, $R^{15}$, $R^{17}$, $R^{18}$, $R^{19}$ and $R^{20}$ preferably has about 6 to 10 carbon atoms. Specific examples of the aryl group which may be substituted with at least one group selected from a hydroxyl group, an amino group which may be substituted with a C1-C4 alkyl group and a C1-C6 alkoxy group include a phenyl and naphthyl group.

The alkoxy group in $R^{13}$, $R^{14}$ and $R^{15}$ preferably has about 1 to 6 carbon atoms and specific examples thereof include a methoxy, ethoxy, n-propoxy, isopropoxy, n-butoxy, tert-butoxy, n-pentyloxy and n-hexyloxy group.

The alkylene and alkenylene groups in W preferably have 2 to 6 carbon atoms. Specific examples of the alkylene group include an ethylene, trimethylene, tetramethylene, methylenedioxy and ethylene-1,2-dioxy group, and specific examples of the alkenylene group include an ethane-1,2-diyl, 1-propene-1,3-diyl and 2-butene-1,4-diyl group.

Specific examples of the amine compound include n-hexylamine, n-heptylamine, n-octylamine, n-nonylamine, n-decylamine, aniline, 2-methylaniline, 3-methylaniline, 4-methylaniline, 4-nitroaniline, 1-naphthylamine, 2-naphthylamine, ethylenediamine, tetramethylenediamine, hexamethylenediamine, 4,4'-diamino-1,2-diphenylethane, 4,4'-diamino-3,3'-dimethyldiphenylmethane, 4,4'-diamino-3,3'-diethyldiphenylmethane, dibutylamine, dipentylamine, dihexylamine, diheptyamine, dioctylamine, dinonylamine, didecylamine, N-methylaniline, piperidine, diphenylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyl-dinonylamine, methyldidecylamine, ethyldibutylamine, ethyldipentylamine, ethyldihexylamine, ethyldiheptylamine, ethyldioctylamine, ethyldinonylamine, ethyldidecyamine, dicyclohexylmethylamine, tris[2-(2-methoxyethoxy)ethyl]amine, triisopropanolamine, N,N-dimethylaniline, 2,6-diisopropylaniline, imidazole, benzimidazole, pyridine, 4-methylpyridine, 4-methylimidazole, bipyridine, 2,2'-dipyridylamine, di-2-pyridyl ketone, 1,2-di(2-pyridyl)ethane, 1,2-di(4-pyridyl)ethane, 1,3-di(4-pyridyl)propane, 1,2-bis(2-pyridyl)ethylene, 1,2-bis(4-pyridyl)ethylene, 1,2-bis(4-pyridyloxy)ethane, 4,4'-dipyridyl sulfide, 4,4'-dipyridyl disulfide, 1,2-bis(4-pyridyl)ethylene, 2,2'-dipicolylamine and 3,3'-dipicolylamine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

A hindered amine compound having a piperidine skelton as disclosed in JP 11-52575 A1 can be also used as the quencher.

In the point of forming patterns having higher resolution, the quaternary ammonium hydroxide is preferably used as the quencher.

When the basic compound is used as the quencher, the present resist composition preferably includes 0.001 to 2% by weight of the basic compound based on the total amount of the resin component, the acid generator and the basic compound.

The present resist composition can contain, if necessary, a small amount of various additives such as a sensitizer, a solution suppressing agent, other polymers, a surfactant, a stabilizer and a dye as long as the effect of the present invention is not prevented.

The present resist composition is usually in the form of a resist liquid composition in which the above-mentioned ingredients are dissolved in a solvent and the resist liquid composition is applied onto a substrate such as a silicon wafer by a conventional process such as spin coating. The solvent used is sufficient to dissolve the above-mentioned ingredients, have an adequate drying rate, and give a uniform and smooth coat after evaporation of the solvent. Solvents generally used in the art can be used.

Examples of the solvent include a glycol ether ester such as ethyl cellosolve acetate, methyl cellosolve acetate and propylene glycol monomethyl ether acetate; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone. These solvents may be used alone and two or more thereof may be mixed to use.

A resist film applied on to the substrate and then dried is subjected to exposure for patterning, then heat-treated to facilitate a deblocking reaction, and thereafter developed with an alkali developer. The alkali developer used may be any one of various alkaline aqueous solution used in the art. Generally, an aqueous solution of tetramethylammonium hydroxide or (2-hydroxyethyl)trimethylammonium hydroxide (commonly known as "choline") is often used.

It should be construed that embodiments disclosed here are examples in all aspects and not restrictive. It is intended that the scope of the present invention is determined not by the above descriptions but by appended claims, and includes all variations of the equivalent meanings and ranges to the claims.

The present invention will be described more specifically by Examples, which are not construed to limit the scope of the present invention. The "%" and "part(s)" used to represent the content of any component and the amount of any material to be used in the following Examples are on a weight basis unless otherwise specifically noted. The weight-average molecular weight of any material in the following Examples is a value found by gel permeation chromatography [HLC-8120GPC Type, Column: G4000HXL and G2000HXL manufactured by TOSOH CORPORATION, Solvent: tetrahydrofuran] using polystyrene as a standard reference material.

Resin Synthesis Example 1

Into the four-necked flask equipped with a stirrer, a reflux condenser and a thermometer, 1200 parts of m-cresol, 56 parts of oxalic acid dehydrate, 378 parts of 90% acetic acid and 1120 parts of methyl isobutyl ketone were charged. The resultant mixture was heated to 80° C. and then, 787 parts of 37% formalin was added dropwise thereto over 1 hour while adjusting the inner temperature to be 87° C. after completion of the addition. The mixture obtained was kept at 87° C. for 12 hours, and 500 parts of methyl isobutyl ketone was added thereto. The resultant mixture was washed 6 times with an ion-exchanged water to obtain a resin solution. 500 Parts of methyl isobutyl ketone was added to the resin solution and the solution obtained was concentrated under reduced pressure to obtain 3364 parts of a resin solution. 6152 Parts of methyl isobutyl ketone and 6774 parts of n-heptane were added to the resin solution obtained, and the resultant mixture was stirred at 60° C. for 1 hour. The mixture was separated to a lower layer containing a resin and an upper layer. The layer containing the resin was diluted with 3800 parts of propylene glycol monomethyl ether acetate and the resultant mixture was concentrated to obtain 1800 parts of a solution containing a novolak resin (content of the novolak resin: 36.6%). The weight-average molecular weight of the novolak resin obtained was 7,750. The novolak resin obtained is called as R1.

Resin Synthesis Example 2

30 Parts of MARUKA LYNCUR S2P (trade name) manufactured by Maruzen Petrochemical Co., Ltd. and 81.9 parts of the solution containing R1, which was obtained in the above-mentioned Resin Synthesis Example 1, were mixed with 240 parts of methyl isobutyl ketone. The resultant solution was concentrated to obtain 300 parts of a solution containing a poly(p-hydroxystyrene) and R1. Into the four-necked flask equipped with a stirrer, a reflux condenser and a thermometer, all amount of the solution containing the poly (p-hydroxystyrene) and R1, 100 parts of methyl isobutyl ketone and 0.01 part of p-toluenesulfonic acid were charged and then 6.61 parts of 1,4-bis(vinyloxymethyl)cyclohexane was added dropwise thereto over 5 minutes at room temperature. The resultant mixture was stirred for 4 hours at room temperature and 0.03 part of triethylamine was added thereto. The mixture obtained was washed 5 times with 140 parts of ion-exchanged water to obtain a solution containing a resin. The solution was concentrated to obtain 75 parts of a solution containing a resin. 220 Parts of propylene glycol monomethyl ether acetate was added to the solution and the mixture obtained was concentrated to obtain 100 parts of a solution containing the resin obtained by the reaction of the poly(p-hydroxystyrene), R1 and 1,4-bis(vinyloxymethyl)cyclohexane (content of the resin: 31.6%). The weight-average molecular weight of the resin obtained was 62,300. The resin obtained is called as A1.

Resin Synthesis Example 3

150 Parts of VP-2500 (trade name) manufactured by Nippon Soda Co., Ltd. was dissolved in 900 parts of methyl isobutyl ketone. The resultant solution was concentrated to obtain 520 parts of a solution containing a poly(p-hydroxystyrene). Into the four-necked flask equipped with a stirrer, a reflux condenser and a thermometer, all amount of the solution containing the poly(p-hydroxystyrene), 530 parts of methyl isobutyl ketone and 0.02 part of p-toluenesulfonic acid were charged and then 51.7 parts of ethyl vinyl ether was added dropwise thereto over 5 minutes at room temperature. The resultant mixture was stirred for 3 hours at room temperature and 0.03 part of triethylamine was added thereto. The mixture obtained was washed 5 times with 400 parts of ion-exchanged water to obtain a resin solution. The resin solution was concentrated to obtain 375 parts of a resin solution. 1125 Parts of propylene glycol monomethyl ether acetate was added to the resin solution and the mixture obtained was concentrated to obtain 440 parts of a solution containing the resin comprising structural units represented by the formulae (content of the resin: 42.0%).

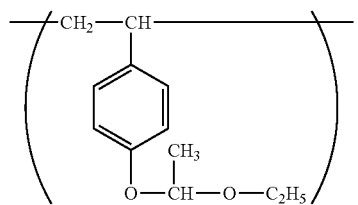

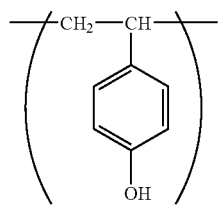

The weight-average molecular weight of the resin obtained was 4,000. The resin obtained is called as R2.

Resin Synthesis Example 4

50 Parts of MARUKA LYNCUR S4P (trade name) manufactured by Maruzen Petrochemical Co., Ltd. was dissolved in 200 parts of methyl isobutyl ketone. The resultant solution was concentrated to obtain 145 parts of a solution containing a poly(p-hydroxystyrene). Into the four-necked flask equipped with a stirrer, a reflux condenser and a thermometer, all amount of the solution containing the poly(p-hydroxystyrene), 355 parts of methyl isobutyl ketone and 0.01 part of p-toluenesulfonic acid were charged and then 7.38 parts of 1,4-bis(vinyloxymethyl)cyclohexane was added dropwise thereto over 5 minutes at room temperature. The resultant mixture was stirred for 3 hours at room temperature and 0.02 part of triethylamine was added thereto. The mixture obtained was washed 5 times with 180 parts of ion-exchanged water to obtain a resin solution. The resin solution was concentrated to obtain 120 parts of a resin solution. 350 Parts of propylene glycol monomethyl ether acetate was added to the resin solution and the mixture obtained was concentrated to obtain 160 parts of a solution containing the resin obtained by the reaction of the poly(p-hydroxystyrene) and 1,4-bis(vinyloxymethyl)cyclohexane (content of the resin: 33.2%). The weight-average molecular weight of the resin obtained was 67,300. The resin obtained is called as R3.

Resin Synthesis Example 5

Into the four-necked flask equipped with a stirrer, a reflux condenser and a thermometer, 120 parts of the solution containing R1, which was obtained in the above-mentioned Resin Synthesis Example 1, 0.007 part of p-toluenesulfonic acid and 120 parts of methyl isobutyl ketone were charged, and then 4.6 parts of 1,4-bis(vinyloxymethyl)cyclohexane was added dropwise thereto over 5 minutes at room temperature. The resultant mixture was stirred for 3 hours at room temperature and then, 0.02 part of triethylamine was added thereto. The resultant mixture was washed five times with 150 parts of ion-exchanged water to obtain a resin solution. The resin solution obtained was concentrated to obtain 100 parts of a resin solution. 6152 Parts of methyl isobutyl ketone and 6774 parts of n-heptane were added to the resin solution obtained, and the resultant mixture was stirred at 60° C. for 1 hour. The mixture was separated to a lower layer containing a resin and an upper layer. The layer containing the resin was diluted with 3800 parts of propylene glycol monomethyl ether acetate and the resultant mixture was concentrated to obtain 1800 parts of a solution containing the resin obtained by the reaction of R1 and 1,4-bis(vinyloxymethyl)cyclohexane (content of the resin: 47.6%). The weight-average molecular weight of the resin obtained was 32,800. The resin obtained is called as R4.

<Acid Generator>
Acid generator S1: triphenylsulfonium 2,4,6-triisopropybenzenesulfonate
Acid generator S2: bis(cyclohexylsulfonyl)diazomethane
Acid generator S3: [2-(4-methylphenyl)sulfonyloxyimino-2H-thiophen-3-ylidene]-(2-methylphenyl)acetonitrile
<Quencher>
Quencher Q1: dicyclohexylmethylamine
Quencher Q2: tris[2-(2-methoxyethoxy)ethyl]amine
<Solvent>
Solvent Y1: propylene glycol monomethyl ether acetate Examples 1 to 4 and Comparative Examples 1 to 3

The following components were mixed to give a solution, and the solution was further filtrated through a fluorine resin filter having a pore diameter of 0.2 μm, to prepare resist liquid.
Resin (kind and amount are described in Table 1)
Acid generator (kind and amount are described in Table 1)
Quencher (kind and amount are described in Table 1)
Solvent (kind and amount are described in Table 1)

TABLE 1

| Ex. No. | Resin (kind/amount (part)) | Acid generator (kind/amount (part)) | Quencher (kind/amount (part)) | Solvent (kind/amount (part)) |
| --- | --- | --- | --- | --- |
| Ex. 1 | A1/6.75 R2/6.75 | S1/0.075 S2/0.4 | Q1/0.015 Q2/0.015 | Y1/55 |
| Ex. 2 | A1/6.75 R2/6.75 | S2/0.4 S3/0.075 | Q1/0.015 Q2/0.015 | Y1/55 |
| Ex. 3 | A1/10.12 R2/3.38 | S1/0.15 | Q1/0.015 | Y1/55 |
| Ex. 4 | A1/13.5 | S1/0.15 | Q1/0.015 | Y1/57 |
| Comp. Ex. 1 | R3/13.5 | S1/0.15 | Q1/0.015 | Y1/65 |
| Comp. Ex. 2 | R2/6.75 R3/6.75 | S1/0.15 | Q1/0.015 | Y1/65 |

TABLE 1-continued

| Ex. No. | Resin (kind/amount (part)) | Acid generator (kind/amount (part)) | Quencher (kind/amount (part)) | Solvent (kind/amount (part)) |
|---|---|---|---|---|
| Comp. Ex. 3 | R4/13.5 | S1/0.075 S2/0.4 | Q1/0.015 Q2/0.015 | Y1/70 |

Each of the resist liquids prepared as above was spin-coated over the silicon wafer so that the thickness of the resulting film became 1.1 μm after drying. After coating each of the resist liquids, the silicon wafers thus coated with the respective resist liquids were each prebaked on a direct hot-plate at a temperature of 100° C. for 1 minute. Using a KrF excimer laser stepper ("NSR-2205EX12B" manufactured by Nikon Corporation, NA=0.55), each wafer on which the respective resist film had been thus formed was exposed to a line and space pattern, while changing stepwise the exposure quantity.

After the exposure, each wafer was subjected to post-exposure baking on a hotplate at a temperature of 100° C. for 1 minute and then to paddle development for 60 seconds with an aqueous solution of 2.38% tetramethylammonium hydroxide.

Each of a pattern developed on the substrate after the development was observed with a scanning electron microscope, and the results of which are shown in Table 2.

Coating property (CP): The focus of the optical microscope was adjusted on the surface of the resist film on the wafer after coating, and the focused parts were observed obliquely by eye. When the surface of the resist film is smooth, the scattered light is not observed, and when the surface of the resist film is rough, the scattered light is observed. When the intense scattered light was observed, its evaluation was marked by "X", and when the intense scattered light was not observed, its evaluation was marked by "○".

Effective Sensitivity (ES): It is expressed as the amount of exposure that the line and space pattern become 1:1 after exposure through 0.40 μm line and space pattern mask and development.

Resolution: It is expressed as the minimum size of space pattern which gave the space pattern split by the line pattern at the exposure amount of the effective sensitivity.

TABLE 2

| Ex. No. | CP | ES (mJ/cm$^2$) | Resolution (μm) |
|---|---|---|---|
| Ex. 1 | ○ | 35 | 0.21 |
| Ex. 2 | ○ | 33 | 0.22 |
| Ex. 3 | ○ | 16 | 0.24 |
| Ex. 4 | ○ | 15 | 0.28 |
| Comp. Ex. 1 | ○ | 16 | 0.40[#1] |
| Comp. Ex. 2 | X | 16 | 0.40[#2] |
| Comp. Ex. 3 | ○ | 21 | 3.0 |

[#1] The decreasing of the film thickness was observed after the development, and the film thickness after the development was 30 to 60% of that before development.
[#2] The pattern was not resolved uniformly.

Example 5 and Comparative Example 4

The following components were mixed to give a solution, and the solution was further filtrated through a fluorine resin filter having a pore diameter of 0.5 μm, to prepare resist liquid.

Resin (kind and amount are described in Table 3)
Acid generator (kind and amount are described in Table 3)
Quencher (kind and amount are described in Table 3)
Solvent (kind and amount are described in Table 3)

TABLE 3

| Ex. No. | Resin (kind/amount (part)) | Acid generator (kind/amount (part)) | Quencher (kind/amount (part)) | Solvent (kind/amount (part)) |
|---|---|---|---|---|
| Ex. 5 | A1/13.5 | S3/0.1 | Q1/0.015 | Y1/29 |
| Comp. Ex. 4 | R4/13.5 | S3/0.1 | Q1/0.015 | Y1/29 |

Each of the resist liquids prepared as above was spin-coated over the silicon wafer so that the thickness of the resulting film became 5.6 μm after drying. After coating each of the resist liquids, the silicon wafers thus coated with the respective resist liquids were each prebaked on a direct hot-plate at a temperature of 110° C. for 90 seconds. Using an i-ray stepper ("NSR 2005i9C" manufactured by Nikon Corporation, NA=0.57), each wafer on which the respective resist film had been thus formed was exposed to a line and space pattern, while changing stepwise the exposure quantity. The illuminance of the i-ray stepper used was 500 mW/cm$^2$ and for example, if sensitivity is 83 mJ/cm$^2$, exposure time is about 170 msec (=83/500).

After the exposure, each wafer was subjected to post-exposure baking on a hotplate at a temperature of 105° C. for 1 minute and then to paddle development for 60 seconds with an aqueous solution of 2.38% tetramethylammonium hydroxide.

Each of a pattern developed on the substrate after the development was observed with a scanning electron microscope, and the results of which are shown in Table 4.

Coating property (CP): The focus of the optical microscope was adjusted on the surface of the resist film on the wafer after coating, and the focused parts were observed obliquely by eye. When the surface of the resist film is smooth, the scattered light is not observed, and when the surface of the resist film is rough, the scattered light is observed. When the intense scattered light was observed, its evaluation was marked by "X", and when the intense scattered light was not observed, its evaluation was marked by "○".

Effective Sensitivity (ES): It is expressed as the amount of exposure that the line and space pattern become 1:1 after exposure through 0.40 μm line and space pattern mask and development.

Resolution: It is expressed as the minimum size of space pattern which gave the space pattern split by the line pattern at the exposure amount of the effective sensitivity.

TABLE 4

| Ex. No. | CP | ES (mJ/cm$^2$) | Resolution (μm) |
|---|---|---|---|
| Ex. 5 | ○ | 83 | 1 |
| Comp. Ex. 4 | ○ | 3 μm line and space pattern was not resolved even though ES was 400 mJ/cm$^2$ | |

Apparent from the results shown in Tables 2 and 4, the resist patterns obtained by Examples 1 to 5 have high resolution and good coating property.

The present chemically amplified positive resist compositions give patterns having high resolution and good coating property.

What is claimed is:

1. A chemically amplified positive resist composition comprising (A) a resin obtainable by reacting a novolak resin, a poly(hydroxystyrene) and a compound having at least two vinyl ether structures, and (B) an acid generator;

wherein the chemically amplified positive resist composition further contains at least one selected from a poly(hydroxystyrene) wherein a part of hydroxyl groups are protected by 1-alkoxyalkyl groups which may be substituted or 2-oxocycloalkyl groups; and a resin containing a structural unit which has an acid-labile group and which itself is insoluble or poorly soluble in an aqueous alkali solution but becomes soluble in an aqueous alkali solution by the action of an acid.

2. The chemically amplified positive resist composition according to claim 1, wherein the poly(hydroxystyrene) is a poly(p-hydroxystyrene).

3. The chemically amplified positive resist composition according to claim 1, wherein the amount ratio of the novolak resin and the poly(hydroxystyrene) in the reaction of the novolak resin, the poly(hydroxystyrene) and the compound having at least two vinyl ether structures is 30/70 to 70/30.

4. The chemically amplified positive resist composition according to claim 1, wherein the compound having at least two vinyl ether structures is 1,4-bis(vinyloxymethyl) cyclohexane or 1,2-bis(vinyloxy)ethane.

5. The chemically amplified positive resist composition according to claim 1, wherein the compound having at least two vinyl ether structures is 1,4-bis(vinyloxymethyl) cyclohexane.

6. The chemically amplified positive resist composition according to claim 1, wherein the chemically amplified positive resist composition contains 0.1 to 10% by weight of the acid generator based on the total amount of the resin component and the acid generator.

7. The chemically amplified positive resist composition according to claim 1, wherein the chemically amplified positive resist composition further comprises a basic compound.

8. A chemically amplified positive resist composition comprising (A) a resin obtainable by reacting a novolak resin, a poly(hydroxystyrene) and a compound having at least two vinyl ether structures, and (B) an acid generator;
wherein the chemically amplified positive resist composition further comprises a poly(hydroxystyrene) wherein a part of hydroxyl groups are protected by 1-alkoxyalkyl groups which may be substituted or 2-oxocycloalkyl groups.

9. The chemically amplified positive resist composition according to claim 1 or 8, wherein the 1-alkoxyalkyl group which may be substituted is an unsubstituted 1-alkoxyalkyl group or a 1-alkoxyalkyl group substituted with at least one selected from an alkoxy group and an acyloxy group.

10. The chemically amplified positive resist composition according to claim 1 or 8, wherein the poly(hydroxystyrene) wherein a part of hydroxyl groups are protected by 1-alkoxyalkyl groups which may be substituted or 2-oxocycloalkyl groups is a poly(hydroxystyrene) comprising a structural unit represented by the formula (Ia):

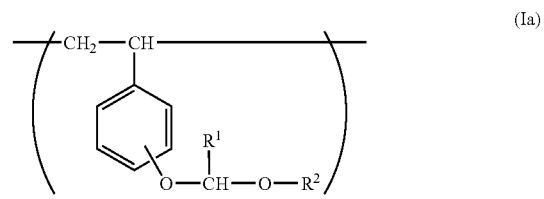

wherein $R_1$ represents a C1-C4 alkyl group and $R^2$ represents a C1-C6 alkyl group or a C5-C7 cycloalkyl group, or $R^1$ and $R^2$ are bonded to form a trimethylene group or a tetramethylene group,
and a structural unit represented by the formula (Ib):

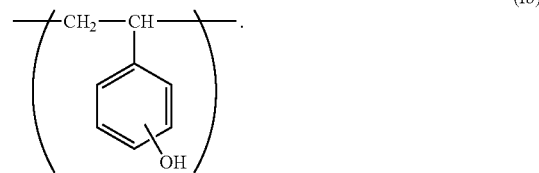

11. The chemically amplified positive resist composition according to claim 10, wherein the structural unit represented by the formula (Ia) is a structural unit represented by the formula (Ic):

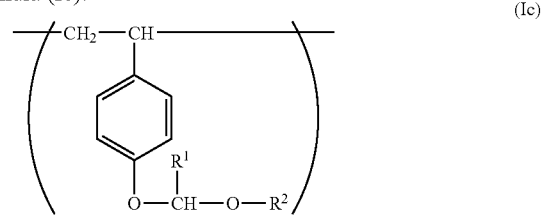

wherein $R^1$ represents a C1-C4 alkyl group and $R^2$ represents a C1-C6 alkyl group or a C5-C7 cycloalkyl group, or $R^1$ and $R^2$ are bonded to form a trimethylene group or a tetramethylene group,
and the structural unit represented by the formula (Ib) is a structural unit represented by the formula (Id):

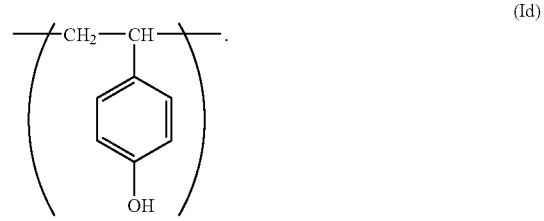

* * * * *